United States Patent [19]
Ouchi

[11] Patent Number: 5,764,670
[45] Date of Patent: Jun. 9, 1998

[54] SEMICONDUCTOR LASER APPARATUS REQUIRING NO EXTERNAL MODULATOR, METHOD OF DRIVING SEMICONDUCTOR LASER DEVICE, AND OPTICAL COMMUNICATION SYSTEM USING THE SEMICONDUCTOR LASER APPARATUS

[75] Inventor: Toshihiko Ouchi, Machida, Japan

[73] Assignee: Canon Kabushiki Kaisha, Tokyo, Japan

[21] Appl. No.: 607,167

[22] Filed: Feb. 26, 1996

[30] Foreign Application Priority Data

| Feb. 27, 1995 | [JP] | Japan | 7-063354 |
| Feb. 27, 1995 | [JP] | Japan | 7-063355 |
| Feb. 13, 1996 | [JP] | Japan | 8-049533 |
| Feb. 13, 1996 | [JP] | Japan | 8-049534 |

[51] Int. Cl.⁶ ............................................. H07S 3/19
[52] U.S. Cl. ....................... 372/45; 372/46; 372/50; 372/96
[58] Field of Search ............................ 372/22, 26, 50, 372/46, 45, 96, 27

[56] References Cited

U.S. PATENT DOCUMENTS

| 5,287,377 | 2/1994 | Fukuzawa et al. | 372/45 |
| 5,563,902 | 10/1996 | Xu et al. | 372/50 |
| 5,659,560 | 8/1997 | Ouchi et al. | 372/27 |

FOREIGN PATENT DOCUMENTS

| 62-042593 | 2/1987 | Japan . |
| 62-144426 | 6/1987 | Japan . |
| 02159781 | 6/1990 | Japan . |

OTHER PUBLICATIONS

"The Institute of Electronics, Information and Communication Engineers 1992 Spring Conference Preparatory Pagers C-203"; pp. 4–245 (No Month).

*Primary Examiner*—James W. Davie
*Attorney, Agent, or Firm*—Fitzpatrick, Cella, Harper & Scinto

[57] ABSTRACT

In a semiconductor laser apparatus, a waveguide has a buried heterostructure. The confinement effect of light to the waveguide having the buried heterostructure is controlled to control laser oscillation itself. Upon execution of intensity modulation, an oscillation/non-oscillation state is selected by controlling the confinement effect of light, and upon execution of polarized wave modulation, TE or TM mode oscillation is selected by controlling the confinement effect of light.

88 Claims, 11 Drawing Sheets

ACTIVE REGION | PHASE ADJUSTING REGION | DBR REGION

5,764,670

SEMICONDUCTOR LASER APPARATUS REQUIRING NO EXTERNAL MODULATOR, METHOD OF DRIVING SEMICONDUCTOR LASER DEVICE, AND OPTICAL COMMUNICATION SYSTEM USING THE SEMICONDUCTOR LASER APPARATUS

BACKGROUND OF THE INVENTION

1. Field of the Invention

The present invention relates to a semiconductor laser apparatus suitably used as a light source which can suppress a dynamic wavelength variation (chirping) even in a high-speed modulation mode, and particularly to a light source for an optical communication, a method of driving a semiconductor laser device used as the light source, and an optical communication system using the semiconductor laser apparatus.

2. Related Background Art

In recent years, an increase in transmission capacity is required in the field of optical communications, and an optical frequency division multiplex (optical FDM) transmission method attained by multiplexing a plurality of wavelengths or frequencies in a single optical fiber has been developed. In the optical FDM, in order to increase the transmission capacity as much as possible, it is important to decrease the wavelength interval. For this purpose, a laser serving as a light source preferably has a small occupied frequency bandwidth or spectral linewidth. However, in a direct intensity modulation method of a light source used in a current optical communication, the spectral linewidth upon modulation increases to about 0.3 nm. Therefore, this method is not suitable for the optical FDM.

As a method that can prevent an increase in spectral linewidth of the light source upon modulation, an external modulation method is known. For example, a Mach-Zehnder type modulator, a semiconductor field absorbing type modulator, and the like have been proposed and developed. In particular, since a semiconductor field absorbing type modulator allows easy integration with a semiconductor laser serving as a light source, a modulator integrated type laser has been developed in terms of its advantages such as a compact structure, small loss, and the like. FIG. 1 shows an example of the modulator integrated type laser (The institute of Electronics, Information and Communication Engineers, 1992 Spring Conference Preparatory Papers C-203). In this laser, a distributed feedback type laser (DFB-LD) and a field absorbing type modulator (MD) using a quantum confinement Stark effect (QCSE) based on a multiple quantum well are integrated in series with each other, and an extinction ratio of about 20 dB is obtained upon application of a voltage of several volts. The structure shown in FIG. 1 includes an n-side electrode 1001, a polyimide layer 1002, an n-InP substrate 1003, an InP buried layer 1004, a p-side electrode 1005, and a non-reflection coating 1006.

However, in the conventional laser with which the modulator is integrated in series, chirping upon modulation is as large as about 0.03 nm although it is smaller than that upon direct modulation. This is caused by a change in return light amount to an active layer of a DFB layer upon driving of the modulator when the exit end face of the modulator side has residual reflection. For this reason, it is pointed out that the residual reflectance must be suppressed to 0.1% or less by the non-reflection coating 1006 on the exit end face of the modulator. In order to form such non-reflection coating, precise composition and film thickness control of, e.g., an SiN film is required, resulting in poor productivity.

At a coupling portion between the laser and the modulator, in order to couple waveguides with different compositions, the crystal growth technique for suppressing the coupling loss is required to have high precision. More specifically, when the modulator portion is to be re-grown, a technique for suppressing the lateral growth of the modulator portion to the junction portion wall surface (mesa portion) is required while the position of the active layer of the modulator is accurately aligned with that of the laser.

Furthermore, the propagation loss upon transmission through the modulator is present. More specifically, since the energy bandgap of the active layer of the modulator is close to that of the laser, light is absorbed, i.e., a loss occurs even in the light ON state (through state). The loss and the extinction ratio of the modulator have a tradeoff relationship therebetween, and impose limitations on the element design.

As another method that can prevent an increase in spectral linewidth upon modulation, a direct polarized wave modulation method (Japanese Laid-Open Patent Application Nos. 62-42593, 62-144426, 2-159781, and the like) has been proposed.

In the polarized wave modulation method, a bias current is fixed at a switching point between the TE and TM modes, as shown in FIG. 2B, and when I1 is modulated by a weak rectangular current $\Delta I1$, the plane of polarization is switched, as shown in FIG. 2C. Using this method, as shown in FIG. 2A, a polarizer 1006 is arranged at the output end face side of a laser 1000 to selectively extract one plane of polarization, thus attaining ASK. According to this method, by modifying the structure of a conventional DFB laser (distributed feedback type laser), chirping can be further suppressed as compared to the external modulation method although direction modulation is performed.

The principle of polarized wave modulation will be briefly described below. A constant current I2 is supplied to one electrode of the laser 1000 shown in FIG. 2A, and a current I1 and a modulated current $\Delta I1$ are supplied to the other electrode, thereby changing the phase difference of a round trip in the DFB laser. With this change, the loss due to a diffraction grating, i.e., the threshold gain changes. In this case, since a waveguide has different effective refractive indices for the TE and TM modes, the phase difference, i.e., the threshold gain changes in different ways. Therefore, the relationship between the threshold values of the TE and TM modes can be changed, thus allowing polarized wave modulation.

The conventionally proposed polarized wave modulation DFB laser realizes polarized wave switching by controlling the phase, and cannot greatly change the gain itself. Therefore, the laser must be manufactured with high precision so that the TE and TM gains are close to each other in the neighborhood of the oscillation wavelength (Bragg wavelength) of the DFB mode. More specifically, the TE and TM gain peaks must match in the active layer, or the positional relationship between the gain peaks and the Bragg wavelength must match on the order of several nm. For this reason, it is difficult to manufacture the laser with high reproducibility. Also, since the phase shift amount of the diffraction grating and end face reflection have a large influence, the phase shift amount, non-reflection coating, and the like are required to have high precision.

Even when the laser is manufactured with relatively high precision, the TE/TM threshold gain difference, the initial phase difference of the diffraction grating, and the like vary among elements. As a result, the laser bias current, the modulation amplitude of the modulated current, and the like vary, resulting in poor productivity.

SUMMARY OF THE INVENTION

The present invention has been made in consideration of the above situation, and has as its object to provide a semiconductor laser apparatus, which can suppress chirping upon modulation to modulate a light output by controlling optical confinement in a waveguide, and has a high light output and high productivity, and a method of driving a semiconductor laser device.

In order to achieve the above object, a semiconductor laser apparatus according to the present invention has the following arrangement.

A semiconductor laser apparatus comprises:

a semiconductor laser device having a resonator structure, the device comprising:

an active layer;

a waveguide for guiding light generated by the active layer; and a neighboring portion formed in the neighborhood of at least a portion of the waveguide; and control means for controlling an optical confinement effect to the waveguide by controlling distribution states of refractive indices of the waveguide and the neighboring portion.

As a more concrete arrangement, the neighboring portion is a portion for performing optical confinement in the lateral direction of the waveguide. A portion to which the control means applies an action is one of the neighboring portion and the waveguide. When the active layer serves as at least a portion of the waveguide, carrier injection into the active layer for light emission and application of the action for control are independently performed. For this reason, when the action is applied to the waveguide, the action is applied to the waveguide in a region without the active layer. As a structure of the portion (neighboring portion, waveguide) to which the action is applied, a quantum well structure can be used. Alternatively, a monocrystalline structure may be used. As an example of the action, application of a reverse field or injection of a forward current may be used. As an example of an arrangement for performing intensity modulation, the refractive index distributions of the waveguide and the neighboring portion are set to enable optical confinement sufficient for laser oscillation upon application of no action, and to disable optical confinement sufficient for laser oscillation upon application of the action. Contrary to this, the refractive index distributions of the waveguide and the neighboring portion may be set to disable optical confinement sufficient for laser oscillation upon application of no action and to enable optical confinement sufficient for laser oscillation upon reception of the action.

Also, an arrangement in which the neighboring portion is formed adjacent to the waveguide, or an arrangement in which a high-resistance layer for improving electrical insulation between the active layer and the neighboring portion is formed between the active layer and the neighboring portion is available. The arrangement in which the high-resistance layer is formed between the active layer and the neighboring portion is particularly effective to independently perform carrier injection into the active layer for light emission and the control when the action is applied to the neighboring portion.

As the resonator structure of the laser device, a Fabry-Perot type arrangement based on opposing end faces, or an arrangement using a diffraction grating as a resonator may be used. As the arrangement using the diffraction grating as the resonator, a distributed feedback type or distributed reflection type arrangement may be adopted. In the case of the distributed feedback type arrangement, it is particularly effective for oscillation at the Bragg wavelength to arrange a phase shift structure in the diffraction grating. When a plurality of electrodes are arranged in the propagation direction of light of the waveguide, electric field application or current injection can be unevenly performed for the waveguide, thus realizing a variable wavelength light source. Also, phase adjustment can be performed. When intensity modulation is performed, since it is preferable to use only one of the TE and TM modes as two polarized wave modes of the waveguide, the two polarized wave modes preferably have different gains. As a concrete arrangement for setting different gains, the ground level of heavy holes may be set to be different from that of light holes in the active layer, or when the semiconductor laser device has a diffraction grating, the pitch of the diffraction grating may be set, so that the wavelength interval between the Bragg wavelength of the TE mode of the diffraction grating and a wavelength corresponding to the bandgap between the ground levels of heavy holes and electrons of the active layer may be set to be smaller than the wavelength interval between the Bragg wavelength of the TM mode of the diffraction grating and a wavelength corresponding to the bandgap between the ground levels of light holes and electrons, or vice versa.

On the other hand, as an arrangement for polarized wave modulation, the refractive index distributions of the waveguide and the neighboring portion may be set, so that laser oscillation is performed in one of the TE and TM modes as the two polarized wave modes of the waveguide upon reception of the first action of the control means, and laser oscillation is performed in the other mode upon reception of the second action of the control means. In order to facilitate polarized wave switching, the TE and TM mode gains can be set to be substantially equal to each other in the semiconductor laser device. As a more concrete arrangement for polarized wave modulation, the change amount of the TE mode threshold gain upon switching from the first action to the second action is different from that of the TM mode threshold gain, the threshold gain of the one mode (i.e., the mode that oscillates upon reception of the first action) upon reception of the first action is smaller than that of the other mode upon reception of the first action, and the threshold gain of the other mode (i.e., the mode that oscillates upon reception of the second action) upon reception of the second action is smaller than the threshold gain of the one mode upon reception of the second action. In view of the refractive index, the change amount of the refractive index difference between the waveguide and the neighboring portion for the TE mode upon switching from the first action to the second action may be different from that for the TM mode upon switching from the first action to the second action. The TE and TM mode gains can be set to be substantially equal to each other by setting the ground level of heavy holes of the active layer to be substantially equal to that of light holes. The ground level of the active layer can be set to be substantially equal to that of light holes by straining a quantum well of a quantum well structure of the active layer. In general, in an unstrained state, a semiconductor having a composition in which the interval between the ground levels of light holes and electrons is larger than that between heavy holes and electrons is normally used. In such an arrangement, it is particularly effective to apply tensile strain. When the semiconductor laser device has a diffraction grating, the TE mode gain can be set to be substantially equal to the TM mode gain by setting the Bragg wavelength of the TM mode of the diffraction grating to be substantially equal to a wavelength corresponding to the bandgap between the ground levels of light holes and electrons of the active layer. In the semiconductor laser apparatus of the present invention, if the semiconductor laser device has a plurality of electrodes in the propagation direction of light of the waveguide, and allows uneven current injection or electric field application in the propagation direction of the waveguide, since the wavelength of laser oscillation can be changed by the uneven current injection or electric field application, the apparatus is suitably used as a variable wavelength light source in a wavelength multiplex communication system. When a variable wavelength arrangement is adopted, variable wavelength control and optical confinement control can be independently performed, the apparatus can be suitably used for either intensity modulation and polarized wave modulation. When polarized wave modulation is performed, if a polarizer for extracting one polarized wave of a light output from the semiconductor laser device is arranged, the light output can be transmitted as an intensity-modulated signal.

DETAILED DESCRIPTION OF THE PREFERRED EMBODIMENTS

Figure 1:
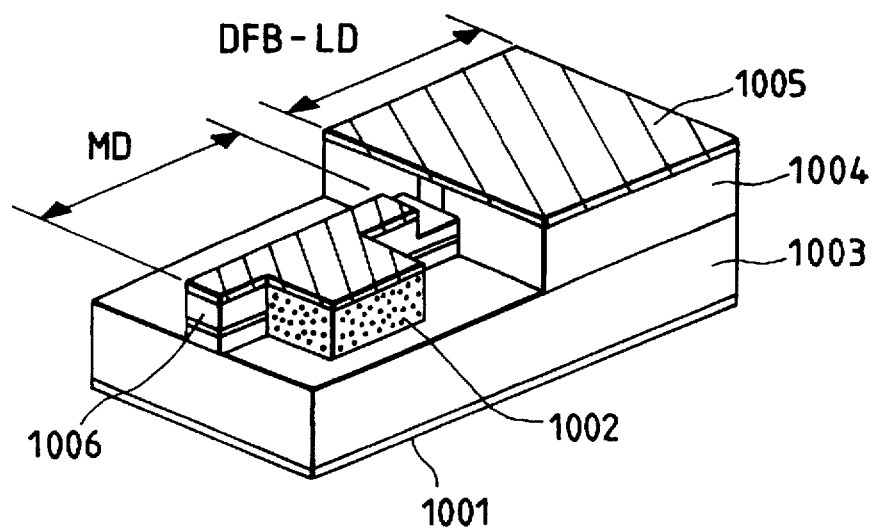
FIG. 1 is a perspective view for explaining a conventional intensity modulator integrated type semiconductor laser device.
Figure 3:
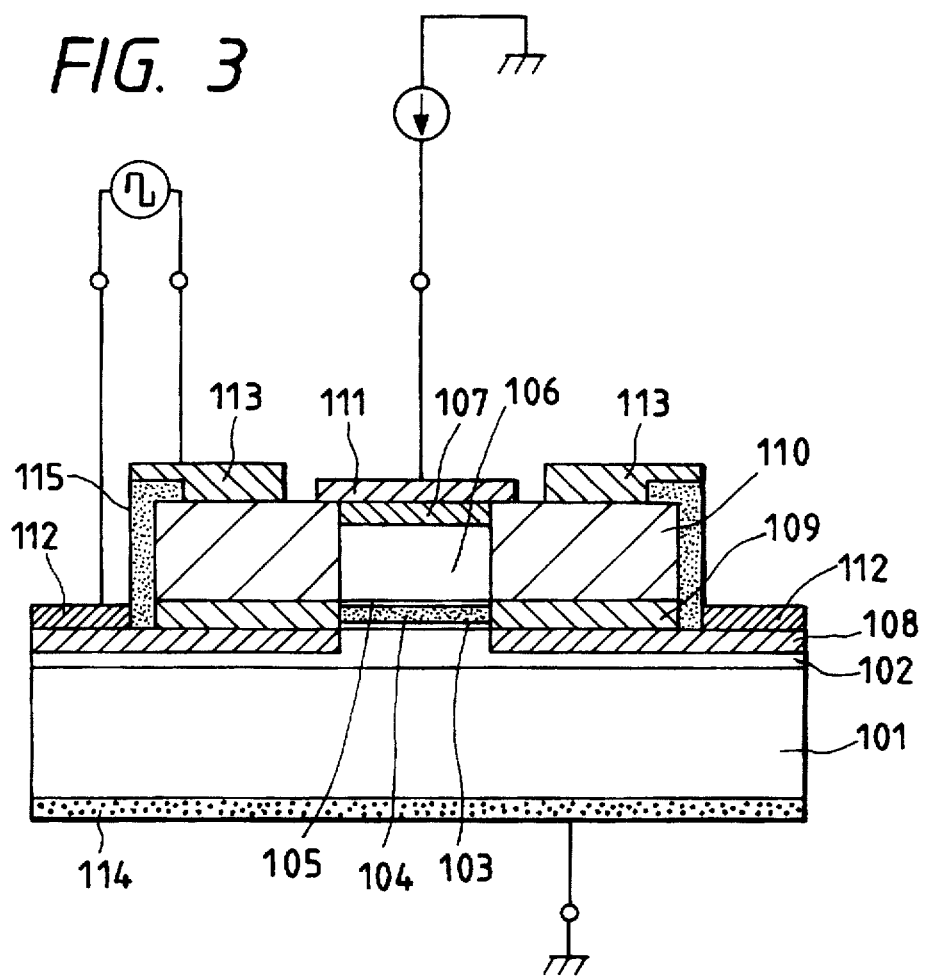
FIG. 3 is a cross-sectional view of a DFB laser (Embodiment 1) according to the present invention.
Figure 2A:
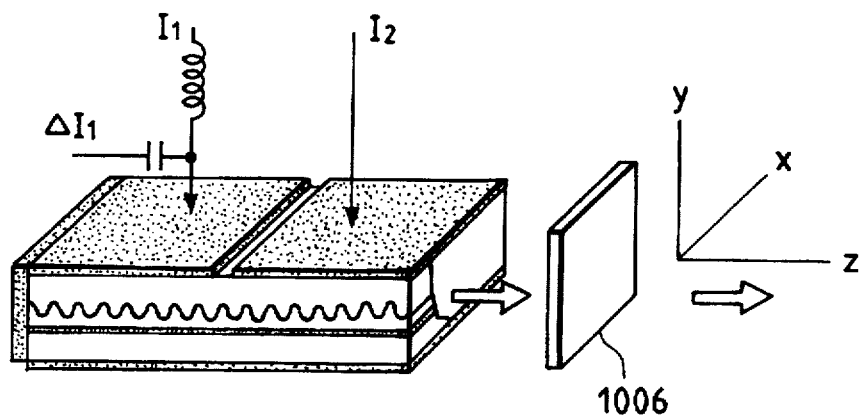
FIGS. 2A to 2C are views for explaining a conventional polarized wave modulation laser apparatus and its driving method.
Figure 2B:
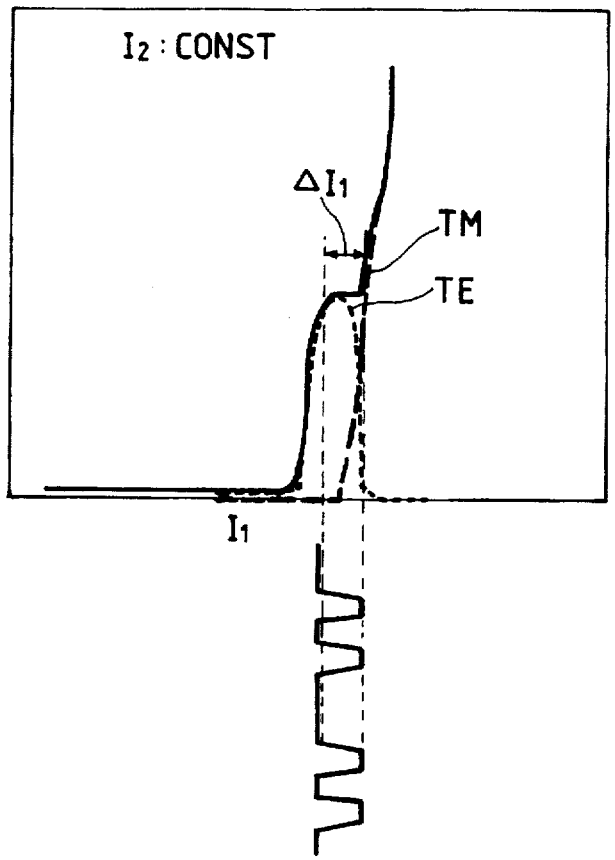
Figure 2C:
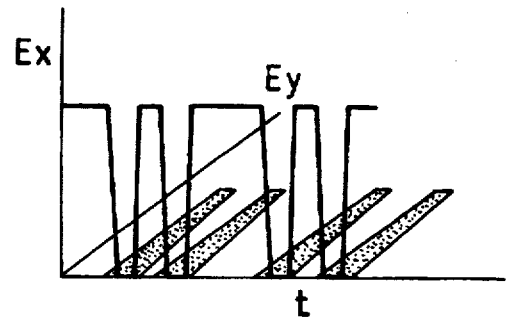

The principle of the present invention will be described below using an example. In order to solve the above-mentioned problems, according to the present invention, a structure equivalent to a modulator is integrated in parallel with a laser. A detailed element structure according to the present invention will be explained below with reference to FIG. 3. The structure of the present invention is similar to a conventional buried heterostructure DFB laser. However, a buried portion has a neighboring portion having a higher energy bandgap (lower refractive index) than that of an active layer in the neighborhood of the active layer of the laser. Upon application of a reverse field to the neighboring portion (confinement control layer), the energy bandgap decreases (the refractive index increases), and approaches that of the laser active layer. Then, the confinement effect, in the lateral direction, of laser oscillation light deteriorates, and the oscillation threshold value increases. For this reason, the optical output of laser oscillation attenuates. At this time, as the confinement control layer, either a single crystal (bulk) or a multiple quantum well (MQW) may be used. In the case of the bulk, since the fundamental absorption end shifts toward the long wavelength side upon application of a voltage due to an effect called a Franz-Keldysh effect (F-K effect), the refractive index increases. A current may be supplied to the confinement control layer in place of a voltage. Upon current injection, the refractive index decreases due to a plasma effect. Thus, the optical confinement effect is improved and the threshold value decreases, thus increasing the light output. Substantially the same principle described above applies even when the arrangement shown in FIG. 3 is slightly modified.

According to the above-mentioned method, since the reflectance at the laser end face does not change unlike in the prior art, the confined or guided modes are stable and chirping can be suppressed. Since the laser active laser and the confinement control layer are coupled not in the propagation direction of light, the required manufacturing precision is not so high as compared to the prior art. Furthermore, the propagation loss is small as compared to the prior art, and the maximum optical power can be increased.

(Embodiment 1)

Embodiment 1 of the present invention will be described below. In this embodiment, intensity modulation is performed. FIG. 3 is a sectional view (a section taken along a plane perpendicular to the direction of a resonator) of a DFB laser according to the present invention. In FIG. 3, an active layer and a confinement control layer have SCH-MQW structures respectively having bandgap wavelengths of 1.56 µm and 1.45 µm. The layer arrangement will be described in detail below. Referring to FIG. 3, the structure comprises an n-InP layer 101 serving as a substrate, an n-InP buffer layer 102 formed with a 0.05-µm deep diffraction grating, a 0.1-µm thick n-InGaAsP lower light guide (or waveguide) layer 103 having a bandgap wavelength λg=1.25 µm, an active layer 104 having a multiple quantum well structure consisting of a total of 10 layers of i-$In_{0.53}Ga_{0.47}As$ (thickness=7 nm) well layers and i-InGaAsP ($\lambda g$=1.25 µm, thickness=10 nm) barrier layers, a 0.02-µm thick p-InGaAsP ($\lambda g$=1.25 µm) upper light guide layer 105, a p-InP cladding layer 106, a p-$In_{0.53}Ga_{0.47}As$ contact layer 107, a p-InP buried layer 108, an SCH-MQW confinement control layer 109 consisting of a 0.2-µm thick p-InGaAsP (kg=1.15 µm) layer, a total of 10 layers of i-$In_{0.53}Ga_{0.47}As$ well layers (thickness=4 nm) and i-InGaAsP ($\lambda g$=1.15 µm, thickness= 10 nm) barrier layers, and a 0.2-µm thick n-InGaAsP ($\lambda g$= 1.15 µm) layer, an n-InP buried layer 110, Cr/AuZnNi/Au layers 111 and 112 serving as p-side electrodes, AuGeNi/Au layers 113 and 114 serving as n-side electrodes, and an insulating film 115. An electrode on the p-InP cladding layer 106 locally has a high carrier concentration by Zn diffusion so as to easily attain an ohmic contact.

In this DFB laser, a lattice-matched multiple quantum well layer is formed, and since transition energy $E_{hh0}$–$E_{e0}$ is smaller than transition energy $E_{lh0}$–$E_{e0}$, the TE mode gain is larger than the TM mode gain. The pitch of the diffraction grating was set so that the distributed feedback wavelength of the diffraction grating, i.e., the oscillation wavelength of the DFB laser was slightly offset to the long wavelength side of a wavelength of 1.56 µm corresponding to transition energy ($E_{hh0}$–$E_{e0}$) between the ground levels of heavy holes and electrons. With this setting, the TM mode had almost no gain, and the laser oscillated only the TE mode.

Figure 4:
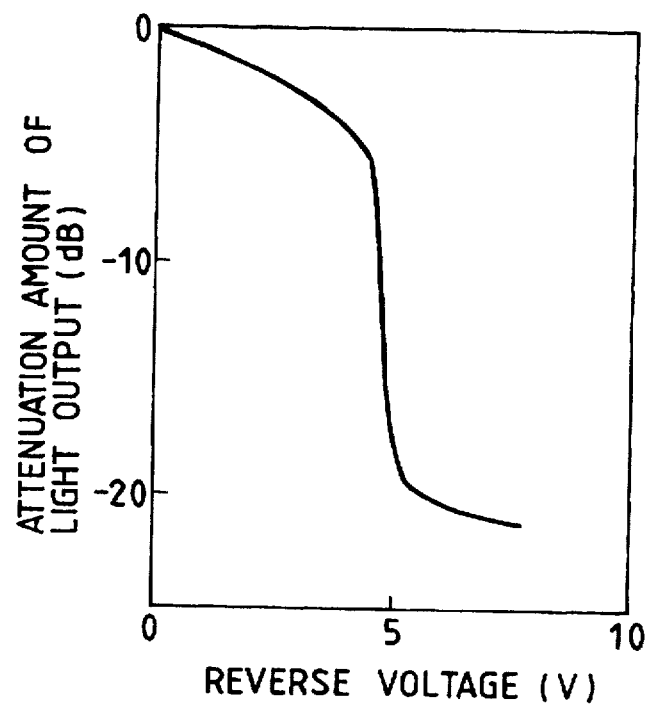
FIG. 4 is a graph showing the relationship between the light output and applied voltage.

With the above-mentioned arrangement, when a forward bias current is supplied across the electrodes 111 and 114, the laser begins to oscillate at a threshold value of about 20 mA. When a reverse field is applied across the electrodes 112 and 113, the refractive index of the confinement control layer 109 increases to deteriorate the confinement effect to the active layer 104. As a result, the threshold value increases and the light output decreases. FIG. 4 shows the relationship between the applied voltage of the reverse field and the light output when the bias current supplied to the laser is 40 mA. As can be seen from FIG. 4, upon application of a voltage of 5 V, the light output attenuates by about 20 dB. It is efficient to apply the electric field to both the right and left sides. However, the electric field may be applied to only one side. The electrodes 111 and 113 may be short-circuited.

When a digital signal of an amplitude of 5 V is applied across the electrodes 112 and 113, intensity modulation with an extinction ratio of about 20 dB can be attained. At this time, the modulation band fell within the range from DC to 3 GHz. On the other hand, the dynamic variation of the oscillation wavelength, i.e., chirping, was about 0.02 nm. Note that the end face process of the element was a non-reflection coating with a reflectance of about 1%, and the required manufacturing precision was not so high as compared to the prior art.

In this embodiment, an unstrained MQW is used as the laser active layer 104. Alternatively, an InGaAsP single layer having a bandgap wavelength of 1.55 µm or a compressively strained MQW (e.g., $In_{0.7}Ga_{0.3}As$ (thickness=3 nm)/ InGaAsP) may be used to further increase the gain difference between the TE and TM modes. On the other hand, a tensilely strained MQW may be used to increase the TM mode gain so as to attain intensity modulation based on TM mode oscillation. The confinement control layer 109 comprises an MQW structure. Alternatively, an InGaAsP single layer having a bandgap wavelength of 1.45 µm may be used to utilize the F-K effect. In FIG. 3, the confinement control layer 109 and the active layer 104 have substantially the same levels, but may have a small difference therebetween or the confinement control layer may be bent. Of course, it is effective to adopt a $\lambda/4$ shift structure in the diffraction grating or to improve single mode characteristics by forming a non-reflection coating on the end face.

According to this embodiment, since the reflectance at the laser end face does not change unlike in the prior art, the modes are stable, and chirping can be suppressed, as described above. Since the laser active laser and the active layer of the modulator (confinement control layer) are coupled not in the propagation direction of light, the required manufacturing precision is not so high as compared to the prior art. Furthermore, the propagation loss is small as compared to the prior art, and the maximum optical power can be increased.

(Embodiment 2)

Embodiment 2 of the present invention exemplifies a laser having substantially the same arrangement as that of Embodiment 1 (except for slightly different layer compositions), and a change in refractive index of a confinement control layer in a buried heterostructure is attained by current injection.

A difference from Embodiment 1 is that the buried waveguide layer is replaced by a layer having a bandgap wavelength of 1.48 µm. With this structure, when no current is injected into the buried waveguide layer, the bandgap difference between the active layer and the buried waveguide layer is small, and the optical confinement effect is small, thus suppressing oscillation. In this layer arrangement, when no current is injected into the confinement control layer, a bias current (in the neighborhood of a threshold current) which does not cause oscillation is injected into the laser active layer. When a current is injected into the confinement control layer, its refractive index decreases due to the plasma effect, and the confinement effect in the lateral direction is improved. As a result, the threshold gain decreases, and the laser begins to oscillate at about 40 mA. In this manner, intensity modulation can be attained.

As compared to Embodiment 1, a DC current to be always injected into the laser active layer is as small as a threshold value or less, thus reducing consumption power.

(Embodiment 3)

Figure 5:
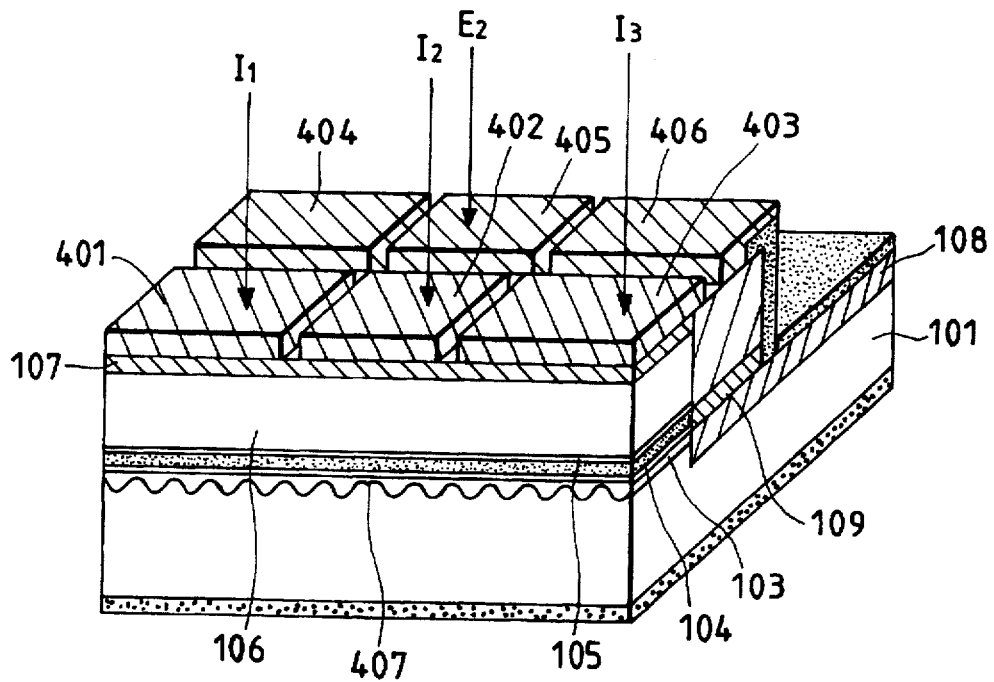
FIG. 5 is a longitudinal perspective sectional view of a three-electrode DFB laser (Embodiment 3) according to the present invention.

In Embodiment 3 of the present invention, the number of electrodes of the laser of Embodiment 1 is increased in the direction of the resonator. FIG. 5 is a perspective sectional view of a three-electrode laser according to this embodiment (the right half of an element is shown). A $\lambda/4$ shift structure 407 is provided at the center of an electrode 402, and a non-reflection coating is formed on two end faces. The lengths of electrodes (401, 404), (402, 405), and (403, 406) are respectively 300 µm, 100 µm, and 300 µm. By changing the ratio of currents to be supplied to the respective electrodes, the oscillation wavelength can be changed. In this element, the oscillation wavelength can be continuously changed by about 2 nm by changing a value I2/(I1+I2+I3) from 0.1 to 0.5 (I1 is the current of the electrode 401, I2, that of the electrode 402, and I3, that of the electrode 403). With this structure, this element can be used as a light source for a wavelength multiplex transmission system. In FIG. 5, the same reference numerals denote parts having the same functions as those in FIG. 3.

An intensity modulation driving operation can be attained by applying a voltage signal of an amplitude of 8 V to only the electrode 405. The reason why the voltage amplitude is larger than that in Embodiment 1 is that the confinement control region corresponds to only the central portion, i.e., is short. However, as compared to Embodiment 1, since the parasitic capacitance is reduced, the modulation band can be broadened, and modulation up to 10 GHz can be attained.

(Embodiment 4)

Figure 6:
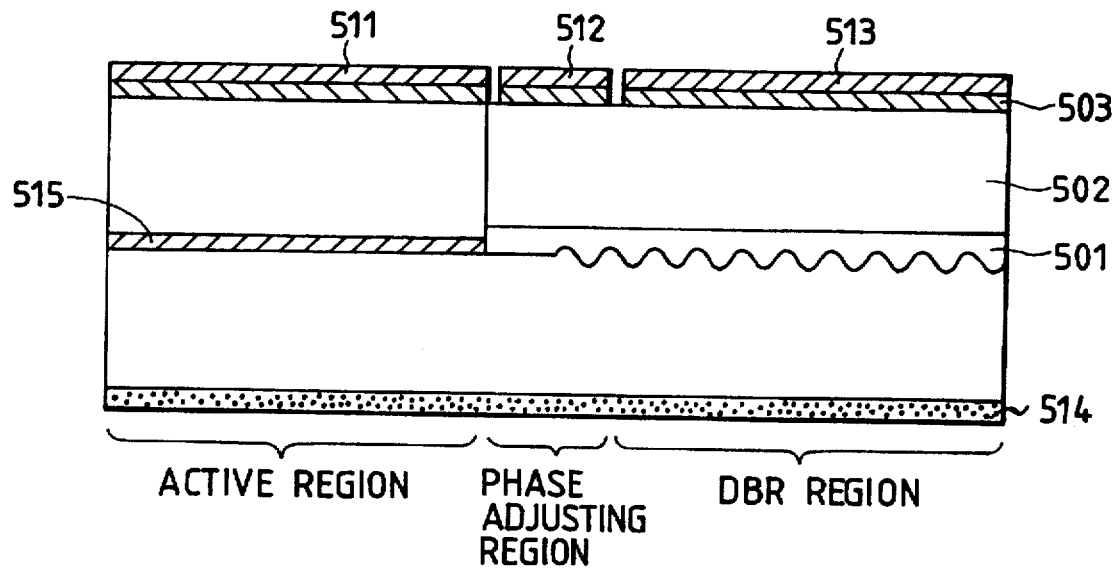
FIG. 6 is a longitudinal sectional view of a variable wavelength DBR laser (Embodiment 4) according to the present invention.

Embodiment 4 of the present invention is applied to a distributed reflection (DBR) laser. FIG. 6 is a sectional view taken along a plane parallel to the resonator of a DBR laser, and a section perpendicular thereto, i.e., a buried heterostructure is substantially the same as that in Embodiment 1. As in Embodiment 3, each of laser injection and electric field application electrodes is divided into three regions (only laser injection electrodes 511, 512, and 513 are illustrated), and these three regions respectively correspond to an active region, a phase adjusting region, and a DBR region. When an electric field is applied to a buried layer of the DBR region to weaken the confinement effect in the lateral direction, the amount of light distributed and reflected to the active region decreases. As a result, the threshold value increase, and the light output attenuates.

In this element, the layer arrangement of the active region having an active layer 515 is substantially the same as that of Embodiment 1. In the DBR region, a diffraction grating is formed after etching is performed to the depth of an InP substrate 516, and an InGaAsP light guide layer 501 having a bandgap wavelength of 1.4 μm, a p-InP cladding layer 502, and a p-InGaAs contact layer 503 are re-grown. In correspondence with this layer arrangement, a confinement control layer comprises an MQW having a bandgap wavelength of 1.3 μm unlike in Embodiment 1.

In this element, the oscillation wavelength can be changed by about 3 nm by changing currents to be injected into the DBR region and the phase adjusting region (across the electrode 513 and an electrode 514, and across the electrodes 512 and 514). Therefore, this element can be used as a light source of a wavelength multiplex transmission system as in Embodiment 3.

(Embodiment 5)

Figure 7:
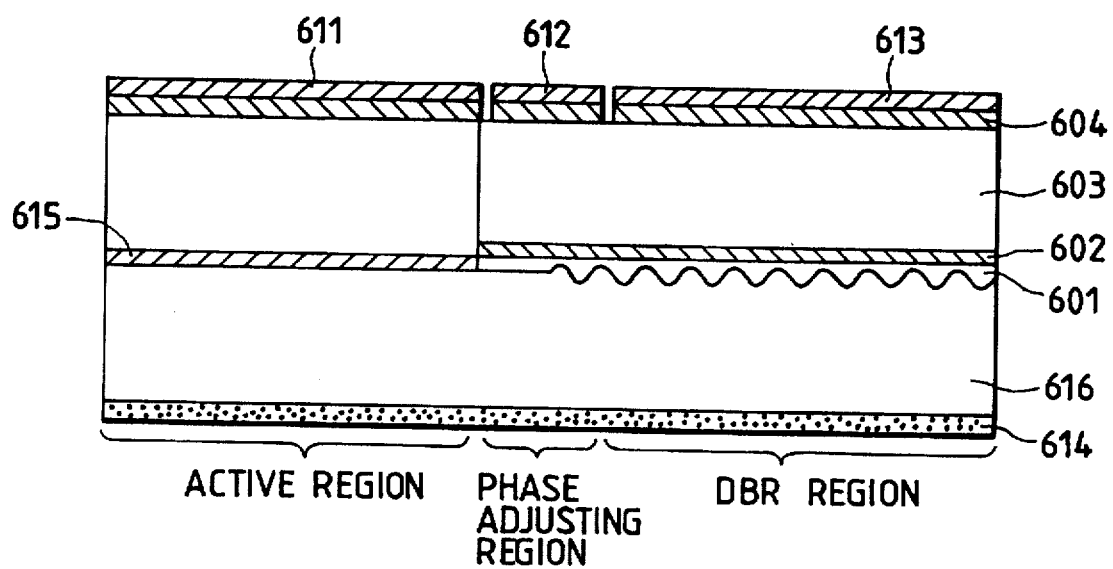
FIG. 7 is a longitudinal sectional view of a DBR laser (Embodiment 5) according to the present invention.

Embodiment 5 of the present invention is applied to a DBR laser as in Embodiment 4. In this embodiment, the bandgap wavelength of a waveguide itself in the DBR region is changed by an electric field. FIG. 7 is a sectional view taken along the direction of the resonator of a DBR laser according to this embodiment. On a diffraction grating formed on a substrate 616, a light guide layer 601 having a bandgap wavelength of 1.25 μm, an MQW layer 602 (the same as the confinement control layer 109 of Embodiment 1) consisting of 10 InGaAs/InGaAsP layers having a bandgap wavelength of 1.45 μm, an InP cladding layer 603, and an InGaAs contact layer 604 are re-grown. The buried structure in the lateral direction is constituted by only a high-resistance InP layer unlike in Embodiments 1 to 4. The layer arrangement of the active region having an active layer 615 is substantially the same as that in Embodiment 1.

In this element, DBR oscillation is attained by injecting a current into the active region (across electrodes 611 and 614). When an electric field is applied to the DBR region (across an electrode 613 and the electrode 614), the confinement effect lessens and the amount of light distributed and reflected to the active region decreases. As a result, the threshold value increase, and the light output attenuates.

As described above, in this element, since intensity modulation is performed by the electric field applied to the DBR region, no wavelength varying operation is performed. As for the phase adjusting region, an electrode 612 is used not in the wavelength varying operation but in an initial setting operation in which DBR oscillation is stable. Alternatively, the phase adjusting region can be used for preventing a current from flowing from the active region upon application of a reverse field to the DBR region.

(Embodiment 6)

Embodiments 1 to 5 exemplify dynamic single mode lasers having a diffraction grating. However, the concept of the present invention can also be applied to a Fabry-Perot laser which has no diffraction grating and has two cleaved end faces. The structure is substantially the same as that shown in FIG. 3, except that the lower light guide layer 103 is formed to have a thickness as small as 0.02 μm, and no diffraction grating is formed. This element can perform intensity modulation as in Embodiment 1 although its single mode characteristics are not so good. This embodiment can be applied to a simple optical communication which does not require any wavelength multiplex, a spatial propagation optical communication, and the like.

(Embodiment 7)

Figure 8:
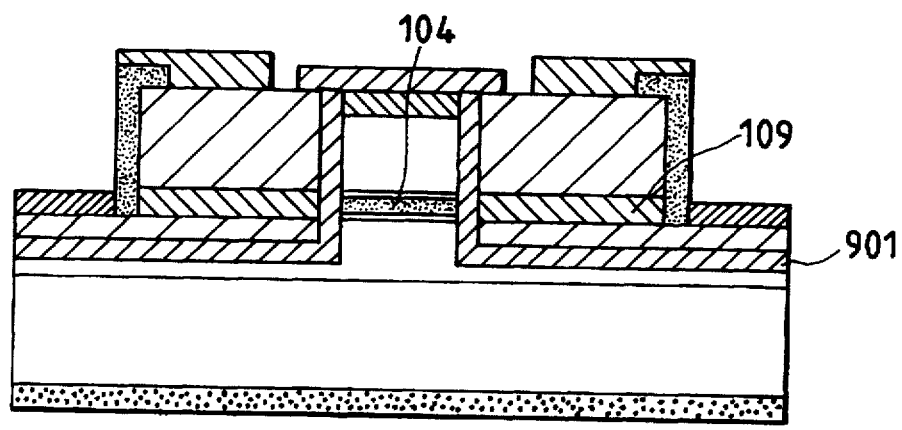
FIG. 8 is a cross-sectional view of a DFB laser (Embodiment 7) according to the present invention.

FIG. 8 is a sectional view of a DFB laser according to Embodiment 7 of the present invention. The structure is substantially the same as that of Embodiment 1. In this embodiment, in order to improve electrical insulation between the active layer 104 and the confinement control layer 109, a 0.3-μm thick high-resistance InP layer 901 is grown on the bottom and side surfaces after mesa etching, and thereafter, the layers are buried and grown as in Embodiment 1. The InP growth can utilize the fact that the growth rates on the mesa side surfaces and bottom surfaces become substantially equal to each other by performing the growth by a low-pressure MOCVD method when the propagation direction of light of the waveguide is along the [011] direction.

In this embodiment, since the current leakage can be reduced, the injection efficiency of the laser active layer 104 can be improved. As a result, the threshold current can be reduced, and light output power can be increased.

As described above, according to the present invention, the waveguide and the neighboring portion (in a portion whose refractive index distribution is to be controlled) need not contact each other, and in order to control optical confinement, the neighboring portion need only be formed in the neighborhood of the waveguide so that light in the waveguide can be coupled.

(Embodiment 8)

Figure 9:
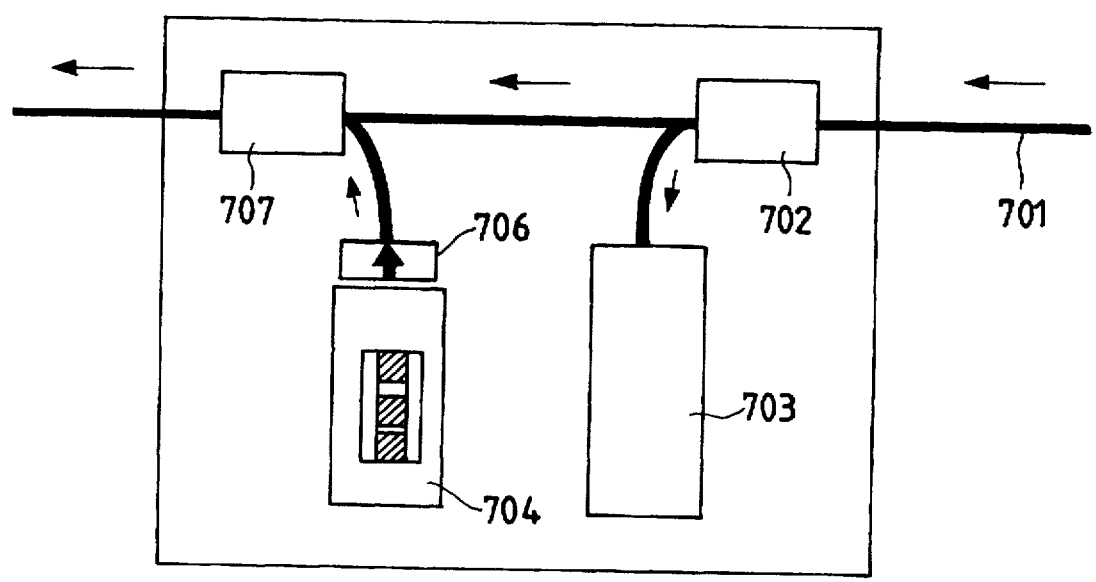
FIG. 9 is a diagram showing the arrangement of a photo-electric conversion unit used in an optical LAN system using a laser according to the present invention.

In this embodiment, intensity modulation transmission using a semiconductor laser according to the present invention is applied to a wavelength multiplex optical LAN system. FIG. 9 shows the arrangement of a photo-electric conversion unit (node) connected to each terminal equipment in this case, and FIG. 10 shows the arrangement of an optical LAN system using the node.

Optical signals are fetched by the node via an optical fiber 701 as a medium connected to the respective units, and some of the optical signals are input to a receiving device 703 comprising a variable wavelength filter via a branching unit 702. The variable wavelength filter comprises a Fabry-Perot filter. Alternatively, a Mach-Zehnder filter, an interference film filter, or the like may be used. The receiving device 703 extracts only an optical signal of a desired wavelength and performs signal detection. On the other hand, when the node transmits an optical signal, an optical signal is intensity-modulated by a laser 704 comprising the variable wavelength DFB laser of Embodiment 3 or the variable wavelength DBR laser of Embodiment 4, and is input onto an optical transmission path via a branching unit 707. At this time, in order to avoid the influence of return light to the laser, an isolator 706 may be inserted.

In some cases, a terminal equipment need only transmit an optical signal of a single wavelength. In such case, the DFB laser of Embodiment 1 or the DBR laser of Embodiment 5 is used. On the contrary, when the variable wavelength range must be further broadened, a plurality of variable wavelength lasers can be arranged.

Figure 10:
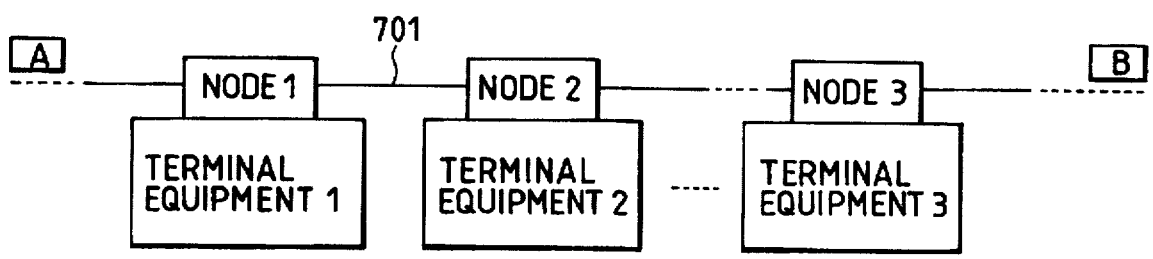
FIG. 10 is a diagram for explaining a network of the optical LAN system.

As a network of the optical LAN system, the system shown in FIG. 10 adopts a bus type network. In this system, nodes can be connected in directions A and B, and a large number of terminal equipments and centers can be arranged as a network. In order to connect a large number of nodes, optical amplifiers must be arranged on the transmission path so as to compensate for attenuation of light. When two nodes are connected to each terminal equipment to define two transmission paths, a bidirectional optical transmission system based on a DQDB method can be realized.

In the intensity modulation according to the present invention, chirping upon modulation is as small as about 0.02 nm, as has been described in Embodiment 1. For this reason, when the variable wavelength width is 2 nm, an optical network system can be realized by high-density wavelength multiplex transmission having 100 channels (=2/0.02). As the network pattern, a loop type network obtained by connecting A and B in FIG. 10, a star type network, or a combination of these networks may be used.

(Embodiment 9)

In Embodiment 9 and the subsequent embodiments, an arrangement that allows polarized wave switching will be exemplified.

The principle upon application of the present invention to polarized wave switching will be described below using an example.

Figure 11:
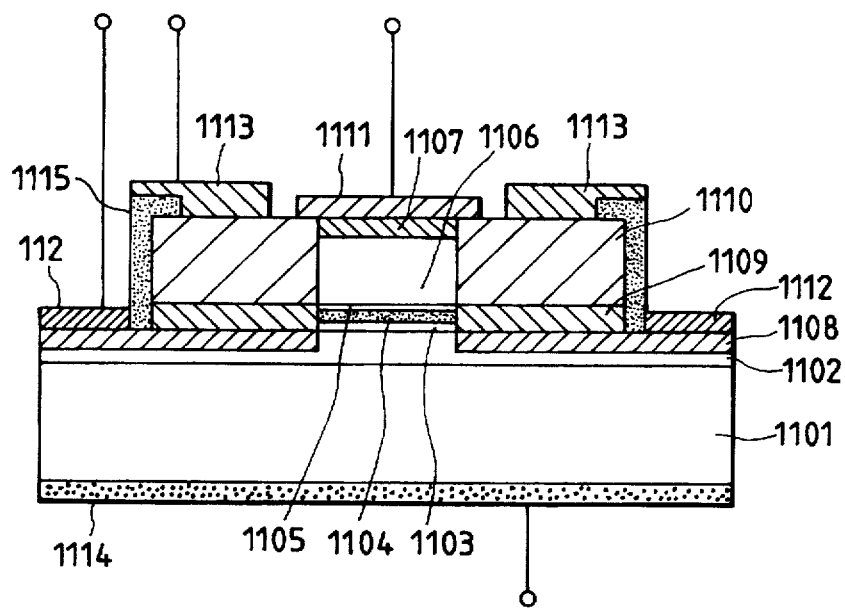
FIG. 11 is a cross-sectional view of a DFB laser (Embodiment 9) according to the present invention.
Figure 12:
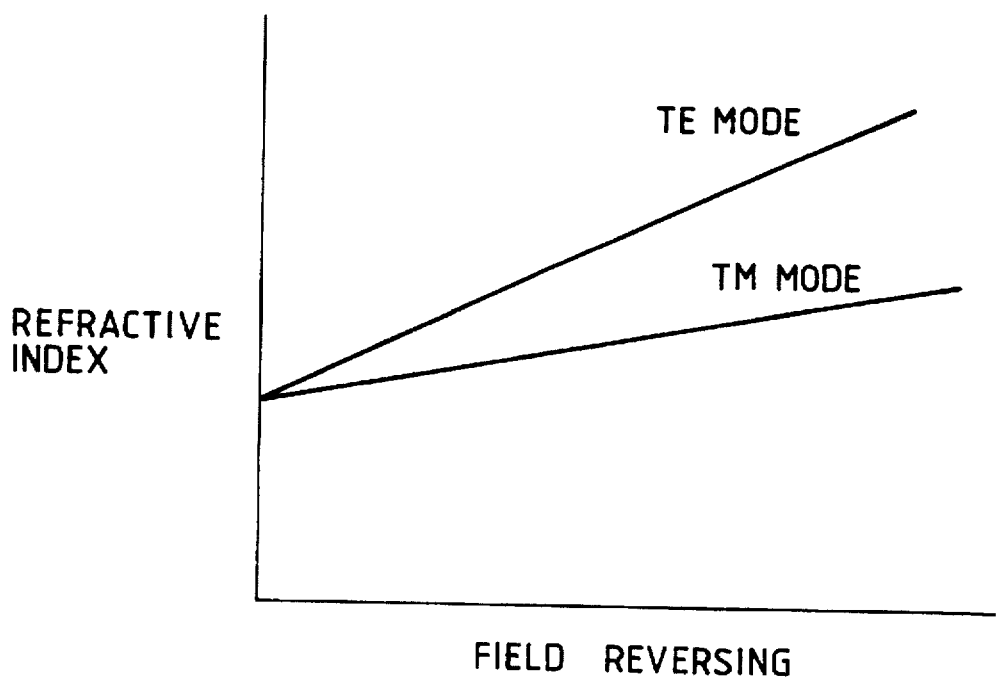
FIG. 12 is a graph for explaining the difference in change in refractive index with respect to the electric field of a multiple quantum well depending on polarized wave modes.

In the present invention, polarized wave switching is attained by positively changing the TE/TM gains in place of changing the phase. A concrete element structure according to the present invention will be described below with reference to FIG. 11. The structure shown in FIG. 11 is similar to a conventional buried heterostructure DFB laser. However, a buried portion has a neighboring portion (confinement control layer) which is formed in the neighborhood of an active layer of the laser and has a higher energy bandgap (lower refractive index) than that of the active layer. When a reverse field is applied to this confinement control layer, the energy bandgap decreases (refractive index increases) and approaches that of the laser active layer. Then, the confinement effect in the lateral direction of laser oscillation light lessens, and the oscillation threshold value increases. At this time, if a multiple quantum well (MQW) is used as the confinement control layer, the bandgap, i.e., the refractive index changes with respect to the electric field at different rates (FIG. 12). That is, the refractive index changes largely in the TE mode, but does not largely change in the TM mode. Such change in energy bandgap of the MQW depending on the electric field is called a quantum confinement Stark effect (QCSE). By utilizing the polarized wave dependence of the QCSE, polarized wave switching can be attained. More specifically, when a low threshold value of the TE mode is set in a non-application state of an electric field, the laser oscillates in the TE mode when no electric field is applied thereto. On the other hand, when an electric field is applied to the confinement control layer, the threshold value of only the TE mode increases, and the threshold value of the TM mode lowers. As a result, the laser oscillates in the TM mode.

In another method, a current may be supplied to the buried layer in place of a voltage. Upon current injection, the refractive index lowers due to a plasma effect. In particular, since the effect is large in the TE mode, the confinement effect is improved due to a decrease in refractive index, and the threshold gain decreases. More specifically, the current injection attains an operation such that the oscillation mode transits from the TM mode to the TE mode, contrary to voltage application. Substantially the same principle as described above applies even when the arrangement shown in FIG. 11 is slightly modified.

When polarized wave modulation is attained by the above-mentioned method, there are two setting parameters, i.e., the laser bias and the electric field, and manufacturing errors can be covered by a drive method.

The detailed arrangement of this embodiment will be described below.

FIG. 11 is a sectional view (a section taken along a plane perpendicular to the direction of the resonator) of a DFB laser according to the present invention. An active layer and a confinement control layer in a buried heterostructure have SCH-MQW structures respectively having bandgap wavelengths of 1.56 µm and 1.45 µm. The layer arrangement will be described in detail below. Referring to FIG. 11, the structure comprises an n-InP layer 1101 serving as a substrate, an n-InP buffer layer 1102 formed with a 0.5-µm deep diffraction grating, a 0.1-µm thick n-InGaAsP lower light guide layer 1103 having a bandgap wavelength λg=1.25 µm, an active layer 1104 having a strained multiple quantum well structure consisting of a total of 10 layers of i-In$_{0.28}$Ga$_{0.72}$As (thickness=10 nm) well layers and i-InGaAsP (λg=1.25 µm, thickness=10 nm) barrier layers, a 0.02-µm thick p-InGaAsP (λg=1.25 µm) upper light guide layer 1105, a p-InP cladding layer 1106, a p-In$_{0.53}$Ga$_{0.47}$As contact layer 1107, a p-InP buried layer 1108, an SCH-MQW confinement control layer 1109 consisting of a 0.2-µm thick p-InGaAsP (λg=1.15 µm) layer, a total of 10 layers of i-In$_{0.53}$Ga$_{0.47}$As well layers (thickness=4 nm) and i-InGaAsP (λg=1.15 µm, thickness=10 nm) barrier layers, and a 0.2-µm thick n-InGaAsP (λg=1.15 µm) layer, an n-InP buried layer 1110, Cr/AuZnNi/Au layers 1111 and 1112 serving as p-side electrodes, AuGeNi/Au layers 1113 and 1114 serving as n-side electrodes, and an insulating layer 1115. An electrode on the p-InP cladding layer 1106 locally has a high carrier concentration by Zn diffusion so as to easily attain an ohmic contact.

In this DFB layer, since the active layer 1104 is a multiple quantum well layer having tensile strain, and is designed to have equal transition energies E$_{hho}$–E$_{eo}$ and E$_{tho}$–E$_{eo}$, the oscillation threshold value in the TM polarized wave mode is higher than that of a conventional DFB laser, thus allowing efficient polarized wave switching.

Figure 13A:
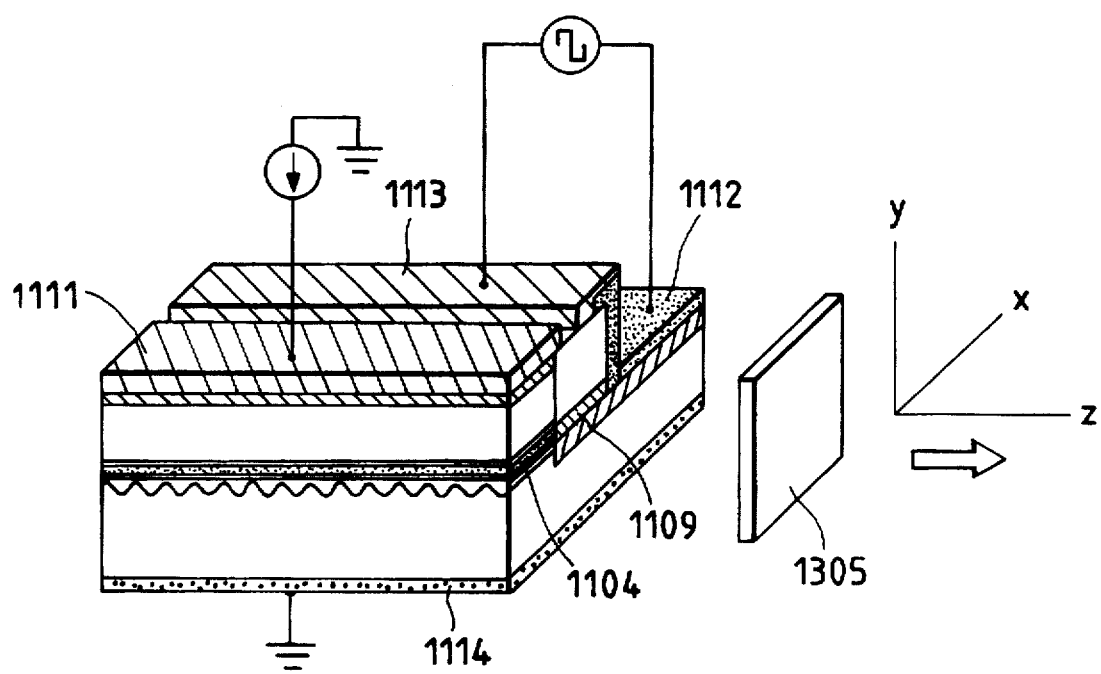
FIGS. 13A and 13B are respectively a perspective view and a graph for explaining the driving method and the oscillation wavelength for a DFB laser according to the present invention.
Figure 13B:
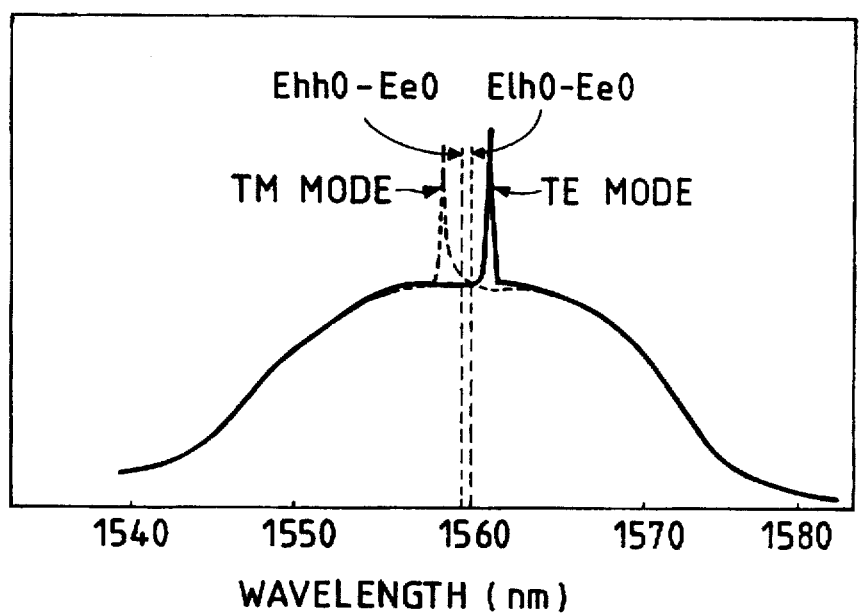

FIG. 13B shows the light emission spectral characteristics obtained when a forward bias current is supplied across the electrodes 1114 and 1111 in the above arrangement so as to set a state immediately before laser oscillation, as shown in the sectional perspective view (only the right half is shown) of FIG. 13A. The wavelength corresponding to the transition energy ($E_{lho}-E_{eo}$) between the ground levels of light holes and electrons is 1.56 μm, and the wavelength corresponding to the transition energy ($E_{hho}-E_{eo}$) between the ground levels of heavy holes and electrons is also 1.56 μm. The light emission spectral characteristics of the TE mode (solid curve) and TM mode (broken curve) substantially overlap each other, and the pitch of the diffraction grating is set to be 240 nm, so that the distributed feedback wavelength by the diffraction grating is offset to the short wavelength side from the wavelength corresponding to $E_{lho}-E_{eo}$. Thus, the TE mode has a Bragg wavelength of 1.562 μm, and the TM mode has a Bragg wavelength of 1.558 μm.

When a forward bias current is supplied across the electrodes 1114 and 1111, the laser oscillates in the TE mode at a threshold value of about 20 mA. In this state, when a reverse field of 5 V is applied across the electrodes 1113 and 1112, as shown in FIG. 12, the refractive index of the confinement control layer 1109 of the buried heterostructure becomes higher than that in the TE mode, and the confinement effect to the active layer 1104 lessens. As a result, the threshold value of the TM mode lowers, and the oscillation mode transits from the TE mode to the TM mode. It is efficient to apply the electric field to both the right and left sides. However, the electric field may be applied to only one side. The electrodes 1111 and 1113 may be short-circuited.

Figure 14:
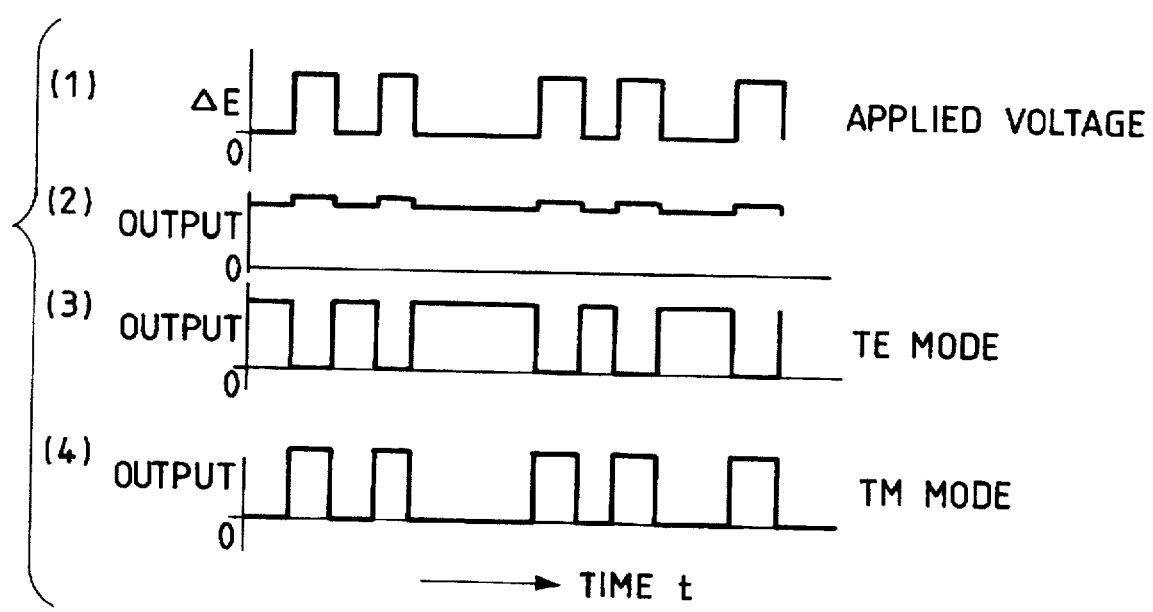
FIG. 14 is a diagram showing the modulated waveforms of the DFB laser according to the present invention.

Thus, when a digital signal of an amplitude of 5 V is applied across the electrodes 1113 and 1112, TE/TM polarized wave modulation can be attained. FIG. 14 shows the waveforms as a function of time. 1) of FIG. 14 shows the modulation voltage waveform, 2) shows the output light from the laser, 3) shows the TE polarized light, and 4) shows the TM polarized light. As shown in FIG. 14, the laser output light does not largely change upon modulation. However, as can be seen from FIG. 14, after separation of polarized light components, the respective polarized light components are modulated in opposite phases. At this time, the modulation band fell within the range from DC to 3 GHz.

Upon transmission of this modulated light, for example, a polarizer 1305 is arranged at the laser exit end face to select TE or TM mode light, and the selected light can be output as intensity modulated light. At this time, the dynamic variation of the oscillation wavelength, i.e., chirping, was 0.01 nm or less.

In this embodiment, a tensilely strained MQW is used as the laser active layer 1104. Alternatively, an InGaAsP single layer having a bandgap wavelength of 1.55 μm, or an unstrained MQW in which the Bragg wavelength is set in the neighborhood of the bandgap wavelength of $E_{lho}-E_{eo}$ may be used. On the other hand, the confinement control layer 1109 of the buried heterostructure has an unstrained MQW structure. Alternatively, in order to enhance the polarized wave dependence, a compressively strained MQW (e.g., $In_{0.7}Ga_{0.3}As$ (thickness=2 nm)/InGaAsP) may be used. In FIG. 11, the confinement control layer 109 and the active layer 104 have substantially the same levels, but may have a small difference therebetween or the confinement control layer may be bent. Of course, it is effective to adopt a λ/4 shift structure in the diffraction grating or to improve the single mode characteristics by forming a non-reflection coating on the end face.

In this embodiment, the relationship between the gain peak of the active layer and the Bragg wavelength and the manufacturing precision required for, e.g., a non-reflection coating can be relaxed as compared to a conventional polarized wave modulation laser based on the phase control method.

(Embodiment 10)

Embodiment 10 of the present invention exemplifies a laser having substantially the same arrangement as that of Embodiment 9 (except for slightly different layer compositions), and a change in refractive index of a confinement control layer in a buried heterostructure is attained by current injection.

A difference from Embodiment 9 is that the buried waveguide layer is replaced by a layer having a bandgap wavelength of 1.48 μm. With this structure, when no current is injected into the buried waveguide layer, the bandgap difference between the active layer and the buried waveguide layer is small, and the optical confinement effect is small, thus suppressing oscillation. Also, the pitch of the diffraction grating is slightly different from that in Embodiment 9, and is set so that the Bragg wavelength is set to be 1.56 μm in the neighborhood of the gain peak in the TM mode and is set to be 1.564 μm in the TE mode, thus obtaining a TM mode gain slightly larger than the TE mode gain. When a current is injected into the confinement control layer, its refractive index decreases due to the plasma effect, and the confinement effect in the lateral direction especially in the TE mode is improved. As a result, the threshold value gain of the TE mode decreases, and the oscillation mode transits from the TM mode to the TE mode at about 40 mA. In this manner, the polarized wave modulation can be attained.

When the initial state is TM oscillation due to a manufacturing error and a driving operation as in Embodiment 9 cannot be performed, the driving method of this embodiment can be used.

(Embodiment 11)

Figure 15:
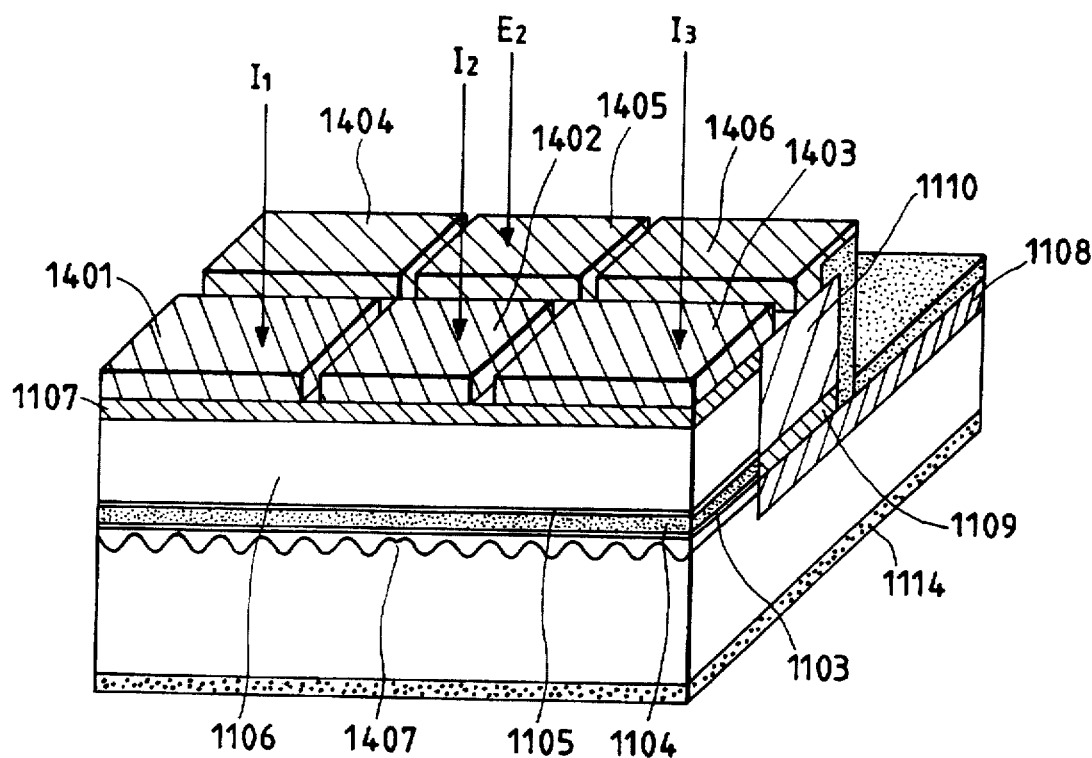
FIG. 15 is a longitudinal perspective sectional view of a three-electrode DFB laser (Embodiment 11) according to the present invention.

In Embodiment 11 of the present invention, the number of electrodes of the laser of Embodiment 9 is increased in the direction of the resonator. FIG. 15 is a perspective sectional view of a three-electrode laser according to the present invention (the right half of an element is shown). A λ/4 shift structure 1407 is provided at the center of an electrode 1402, and a non-reflection coating is formed on two end faces. The lengths of electrodes (1401, 1404), (1402, 1405), and (1403, 1406) are respectively 300 μm, 100 μm, and 300 μm. By changing the ratio of currents to be supplied to the respective electrodes, the oscillation wavelength can be changed. In this element, the oscillation wavelength can be continuously changed by about 2 nm by changing a value I2/(I1+I2+I3) from 0.1 to 0.5 (I1 is the current of the electrode 1401, I2, that of the electrode 1402, and I3, that of the electrode 1403). With this structure, this element can be used as a light source for a wavelength multiplex transmission system. In FIG. 15, the same reference numerals denote parts having the same functions as those in FIG. 11.

A polarized wave modulation driving operation can be attained by applying a voltage signal of an amplitude of 8 V to only the electrode 1405. The reason why the voltage amplitude is larger than that in Embodiment 9 is that the confinement control region corresponds to only the central portion, i.e., is short. However, as compared to Embodiment 9, since the parasitic capacitance is reduced, the modulation band can be broadened, and modulation up to 10 GHz can be attained.

(Embodiment 12)

Figure 16:
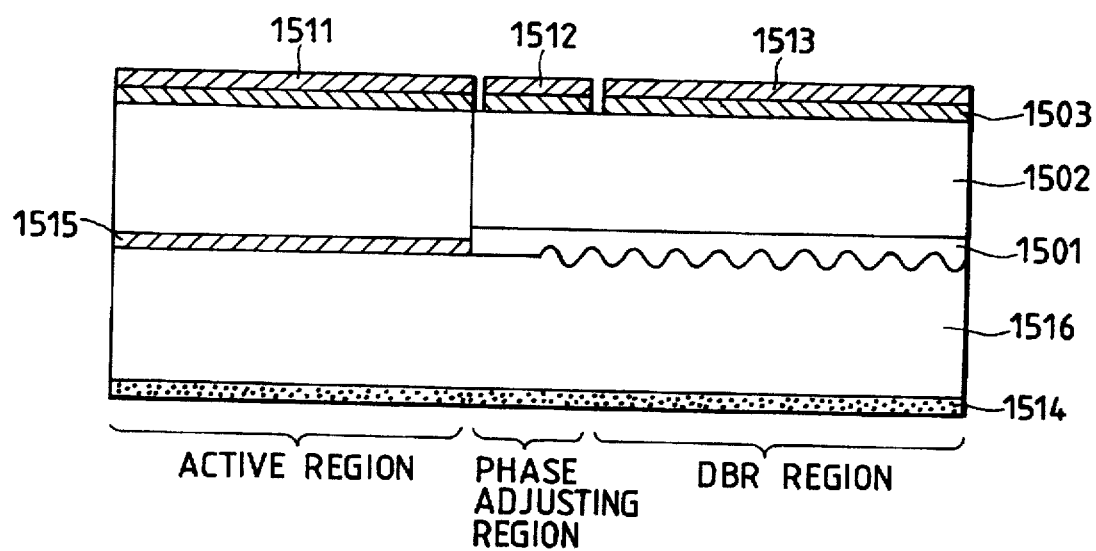
FIG. 16 is a longitudinal sectional view of a variable wavelength DBR laser (Embodiment 12) according to the present invention.

Embodiment 12 of the present invention is applied to a distributed reflection (DBR) laser. FIG. 16 is a sectional view taken along a plane parallel to the resonator of a DBR laser, and a section perpendicular thereto, i.e., a buried heterostructure is substantially the same as that in Embodiment 9. As in Embodiment 11, each of laser injection and electric field application electrodes is divided into three regions (only laser injection electrodes 1511, 1512, and 1513 are illustrated), and these three regions respectively correspond to an active region, a phase adjusting region, and a DBR region. When an electric field is applied to a buried layer of the DBR region to weaken the confinement effect in the lateral direction with respect to the TE mode, the amount of light distributed and reflected to the active region increases in the TM mode. As a result, the oscillation mode transits from the TE mode to the TM mode.

In this element, the layer arrangement of the active region having an active layer 1515 is substantially the same as that of Embodiment 9. In the DBR region, a diffraction grating is formed after etching is performed to the depth of an InP substrate 1516, and an InGaAsP light guide layer 1501 having a bandgap wavelength of 1.4 µm, a p-InP cladding layer 1502, and a p-InGaAs contact layer 1503 are re-grown. A confinement control layer of a buried layer comprises an MQW having a bandgap wavelength of 1.3 µm unlike in Embodiment 9.

In this element, the oscillation wavelength can be changed by about 3 nm by changing currents to be injected into the DBR region and the phase adjusting region (across the electrode 1513 and an electrode 1514, and across the electrodes 1512 and 1514). Therefore, this element can be used as a light source of a wavelength multiplex transmission system as in Embodiment 11.

(Embodiment 13)

Figure 17:
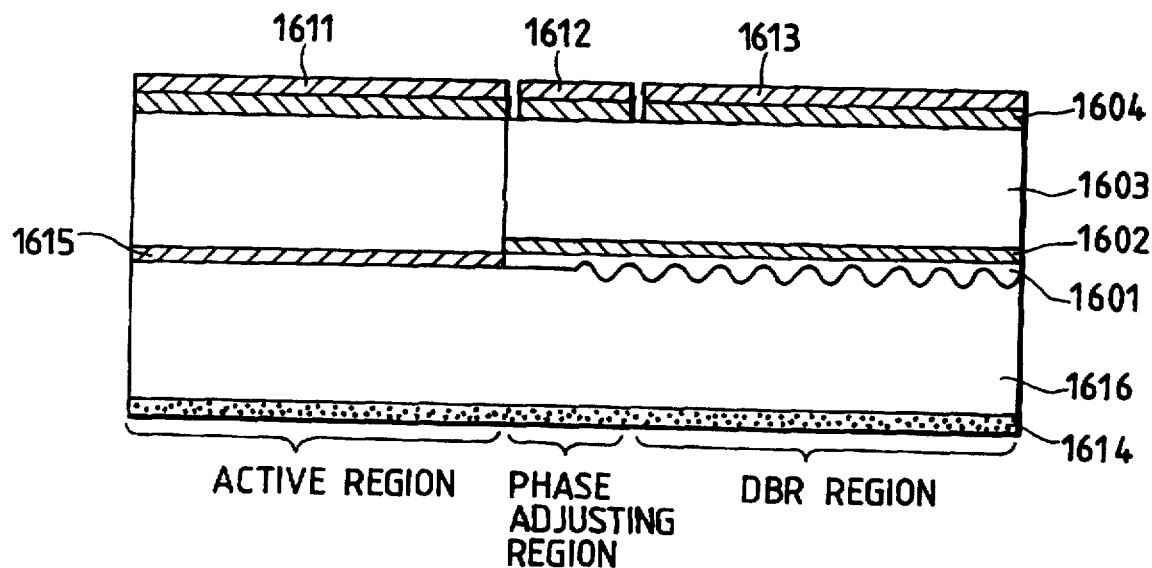
FIG. 17 is a longitudinal sectional view of a DBR laser (Embodiment 13) according to the present invention.

Embodiment 13 of the present invention is applied to a DBR laser as in Embodiment 12. In this embodiment, the bandgap wavelength of a waveguide itself in the DBR region is changed by an electric field. FIG. 17 is a sectional view taken along the direction of the resonator of a DBR laser according to the present invention. On a diffraction grating formed on a substrate 1616, a light guide layer 1601 having a bandgap wavelength of 1.25 µm, an MQW layer 1602 (the same as the confinement control layer 1109 of Embodiment 9) consisting of 10 InGaAs/InGaAsP layers having a bandgap wavelength of 1.45 µm, an InP cladding layer 1603, and an InGaAs contact layer 1604 are re-grown. The buried structure in the lateral direction is constituted by only a high-resistance InP layer unlike in Embodiments 9 to 12. The layer arrangement of the active region having an active layer 1615 is substantially the same as that in Embodiment 9.

In this element, DBR oscillation is obtained by injecting current (between electrodes 1611 and 1614) into the active region. When an electric field (between the electrodes 1613 and 1614) is applied to the DBR region, confinement to the TE mode is degraded to reduce the amount of light to be distributed and reflected, so that the amount of light distributed and reflected with respect to the TM mode is greater than that with respect to the TE mode. For this reason, transition from the TE mode to the TM mode is made.

In this element, since polarized wave modulation is performed by the electric field applied to the DBR region, no wavelength varying operation is performed. As for the phase adjusting region, an electrode 1612 is used not in the wavelength varying operation but in an initial setting operation in which DBR oscillation is stable. Alternatively, the phase adjusting region can be used for preventing a current from flowing from the active region upon application of a reverse field to the DBR region.

(Embodiment 14)

Embodiments 9 to 13 exemplify polarized wave switching in dynamic single mode lasers having a diffraction grating. However, the concept of the present invention can also be applied to a Fabry-Perot laser which has no diffraction grating and has two cleaved end faces. The structure is substantially the same as that shown in FIG. 11, except that the lower light guide layer 1103 is formed to have a thickness as small as 0.02 µm, and no diffraction grating is formed.

This element can perform polarized wave modulation as in Embodiment 9 although its single mode characteristics are not so good. This embodiment can be applied to a simple optical communication which does not require any wavelength multiplex, a spatial propagation optical communication, optical information processing, and the like.

(Embodiment 15)

Figure 18:
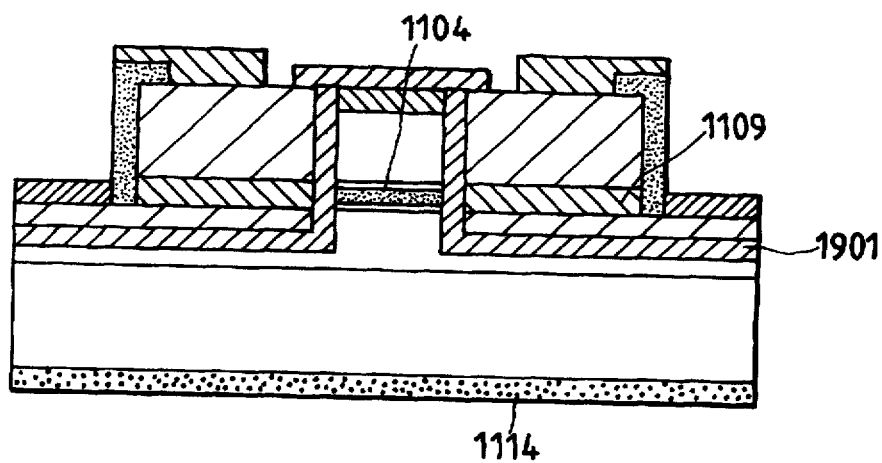
FIG. 18 is a cross-sectional view of a DFB laser (Embodiment 14) according to the present invention.

FIG. 18 is a sectional view of a DFB laser according to Embodiment 15 of the present invention. The structure is substantially the same as that of Embodiment 9. In this embodiment, in order to improve electrical insulation between the active layer 1104 and the confinement control layer 1109, a 0.3-µm thick high-resistance InP layer 1901 is grown on the bottom and side surfaces after mesa etching, and thereafter, the layers are buried and grown as in Embodiment 9. The InP growth can utilize the fact that the growth rates on the mesa side surfaces and bottom surfaces (100) become substantially equal to each other by performing the growth by a low-pressure MOCVD method when the propagation direction of light of the waveguide is along the [011] direction.

In this embodiment, since the current leakage can be reduced, the injection efficiency of the laser active layer 1104 can be improved. As a result, the threshold current can be reduced, and light output power can be increased.

(Embodiment 16)

Figure 19:
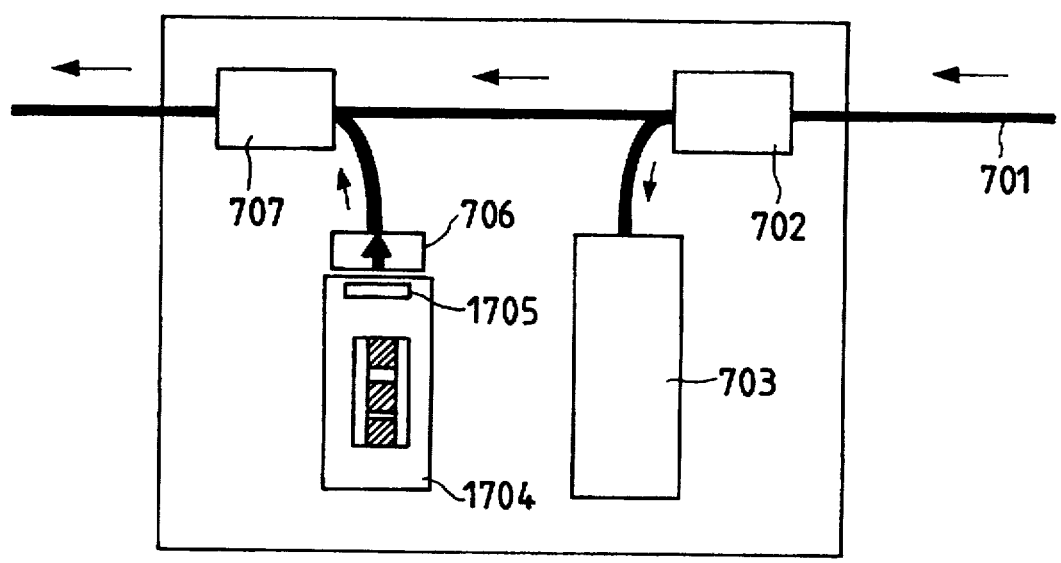
FIG. 19 is a diagram showing the arrangement of a photo-electric conversion unit used in an optical LAN system using a laser according to the present invention.

In this embodiment, intensity modulation transmission using a semiconductor laser according to the present invention is applied to a wavelength multiplex optical LAN system. FIG. 19 shows the arrangement of a photo-electric conversion unit (node) connected to each terminal equipment in this case. The arrangement of an optical LAN system using the node is the same as that shown in FIG. 10.

Optical signals are fetched by the node via an optical fiber 701 as a medium connected to the respective units, and some of the optical signals are input to a receiving device 703 comprising a variable wavelength filter via a branching unit 702. The variable wavelength filter comprises a Fabry-Perot filter. Alternatively, a Mach-Zehnder filter, an interference film filter, or the like may be used. The receiving device 703 extracts only an optical signal of a desired wavelength and performs signal detection. On the other hand, when the node transmits an optical signal, an optical signal is polarized wave-modulated by a laser 1704 comprising the variable wavelength DFB laser of Embodiment 11 or the variable wavelength DBR laser of Embodiment 12, and light converted into intensity-modulated light by a polarizer 1705 is input onto an optical transmission path via a branching unit 707. At this time, in order to avoid the influence of return light to the laser, an isolator 706 may be inserted.

In some cases, a terminal equipment need only transmit an optical signal of a single wavelength. In such case, the DFB laser of Embodiment 9 or the DBR laser of Embodiment 13 is used. On the contrary, when the variable wavelength range must be further widened, a plurality of variable wavelength lasers can be arranged.

In the polarized wave modulation according to the present invention, chirping upon modulation is as small as about 0.01 nm, as has been described in Embodiment 9. For this reason, when the variable wavelength width is 2 nm, an optical network system can be realized by high-density wavelength multiplex transmission having 100 channels (=2/0.01). As a network pattern, a loop type network by connecting A and B in FIG. 10, a star type network, or a combination of these networks may be used.

In this embodiment, the polarizer may be excluded to transmit signals in the two polarized wave mode (see 3) and 4) in FIG. 14), and the receiving side may perform reception detection by obtaining a differential output of the two signals.

What is claimed is:

1. A semiconductor laser apparatus comprising:
   a semiconductor laser device having a resonator structure, said device comprising:
      an active layer;
      a waveguide for guiding light generated by said active layer; and
      a layer neighboring at least a portion of said waveguide; and
   control means for controlling an optical confinement effect to said waveguide by controlling distribution states of refractive indices of said waveguide and said neighboring layer.

2. An apparatus according to claim 1, wherein said control means controls the optical confinement effect to said waveguide by said neighboring layer by controlling the refractive index of said neighboring layer.

3. An apparatus according to claim 2, wherein said neighboring layer comprises a confinement control layer for attaining optical confinement in a lateral direction of said waveguide.

4. An apparatus according to claim 3, wherein said confinement control layer has a quantum well structure.

5. An apparatus according to claim 3, wherein said confinement control layer has a monocrystalline structure.

6. An apparatus according to claim 1, wherein said control means controls the refractive index of said neighboring layer by applying a reverse field to said neighboring layer.

7. An apparatus according to claim 1, wherein said control means controls the refractive index of said neighboring layer by injecting a forward bias current into said neighboring layer.

8. An apparatus according to claim 1, wherein said control means controls the refractive index of said waveguide in a region other than a region where said active layer is present.

9. An apparatus according to claim 8, wherein said waveguide in the region, the refractive index of which is controlled, has a quantum well structure.

10. An apparatus according to claim 8, wherein said waveguide in the region, the refractive index of which is controlled, has a monocrystalline structure.

11. An apparatus according to claim 8, wherein said control means controls the refractive index of said waveguide in the region, the refractive index of which is controlled, by applying a reverse field to said waveguide in the region, the refractive index of which is controlled.

12. An apparatus according to claim 8, wherein said control means controls the refractive index of said waveguide in the region, the refractive index of which is controlled, by injecting a forward bias current into said waveguide in the region, the refractive index of which is controlled.

13. An apparatus according to claim 1, wherein refractive index distributions of said waveguide and said neighboring layer are set to attain optical confinement sufficient for laser oscillation upon application of no action by said control means.

14. An apparatus according to claim 1, wherein refractive index distributions of said waveguide and said neighboring layer are set to attain optical confinement sufficient for laser oscillation upon application of an action by said control means.

15. An apparatus according to claim 1, wherein said neighboring layer is formed adjacent to said waveguide.

16. An apparatus according to claim 2, wherein a high-resistance layer for improving electrical insulation between said active layer and said neighboring layer is formed between said active layer and said neighboring layer.

17. An apparatus according to claim 1, wherein said active layer serves as at least a portion of said waveguide.

18. An apparatus according to claim 1, wherein said semiconductor laser device comprises a diffraction grating as the resonator structure.

19. An apparatus according to claim 1, wherein said semiconductor laser device comprises a Fabry-Perot type laser device having two opposing end faces as the resonator structure.

20. An apparatus according to claim 18, wherein said semiconductor laser device comprises a distributed feedback type laser device in which the diffraction grating is formed along said active layer, and the diffraction grating has a phase shift structure.

21. An apparatus according to claim 8, wherein said semiconductor device comprises a distributed reflection type laser device in which a diffraction grating serving as the resonator structure is arranged in series with said active layer, and said waveguide in the region, the refractive index of which is controlled, corresponds to the waveguide in a distributed reflection region in which the diffraction grating is arranged.

22. An apparatus according to claim 1, wherein a plurality of electrodes are arranged in a propagation direction of light of said waveguide.

23. An apparatus according to claim 1, wherein said semiconductor laser device has different gains in TE and TM modes as two polarized wave modes of said waveguide.

24. An apparatus according to claim 23, wherein a difference between the gains of the TE and TM modes is obtained by setting a ground level of heavy holes to be different from a ground level of light holes in said active layer.

25. An apparatus according to claim 23, wherein said semiconductor laser device comprises a diffraction grating, and the difference between the gains of the TE and TM modes is obtained in such a manner that:
   a pitch of the diffraction grating is set so that one of a wavelength interval between a Bragg wavelength of the TE mode of the diffraction grating and a wavelength corresponding to a bandgap between ground levels of heavy holes and electrons of said active layer, and a wavelength interval between a Bragg wavelength of the TM mode of the diffraction grating and a wavelength corresponding to a bandgap between ground levels of light holes and electrons is smaller than the other.

26. An apparatus according to claim 1, wherein refractive index distributions of said waveguide and said neighboring portion are set so that laser oscillation is performed in one of TE and TM modes as two polarized wave modes of said waveguide upon application of a first action by said control means, and laser oscillation is performed in the other mode upon application of a second action by said control means.

27. An apparatus according to claim 26, wherein said semiconductor laser device has substantially equal gains of the TE and TM modes.

28. An apparatus according to claim 26, wherein a change amount of a threshold gain of the TE mode upon switching from the first action to the second action is different from a change amount of a threshold gain of the TM mode upon switching from the first action to the second action, and wherein the threshold gain of the one mode that oscillates upon reception of the first action is smaller than that of the other mode upon reception of the first action, and the threshold gain of the other mode that oscillates upon reception of the second action is smaller than the threshold gain of the one mode upon reception of the second action.

29. An apparatus according to claim 26, wherein a change amount of a refractive index difference between said waveguide and said neighboring portion for the TE mode upon switching from the first action to the second action is different from a change amount of a refractive index difference between said waveguide and said neighboring portion for the TM mode upon switching from the first action to the second action.

30. An apparatus according to claim 28, wherein said control means applies the first and second actions to said neighboring layer.

31. An apparatus according to claim 28, wherein said control means applies the first and second actions to said waveguide in a region other than a region where said active layer is present.

32. An apparatus according to claim 30, wherein said neighboring portion comprises a confinement control layer for attaining optical confinement in a lateral direction of said waveguide.

33. An apparatus according to claim 32, wherein said confinement control layer has a quantum well structure.

34. An apparatus according to claim 32, wherein said confinement control layer has a monocrystalline structure.

35. An apparatus according to claim 30, wherein said control means applies a reverse field to said neighboring layer as the first and second actions.

36. An apparatus according to claim 30, wherein said control means injects a forward bias current into said neighboring layer as the first and second actions.

37. An apparatus according to claim 31, wherein said waveguide in the region, the refractive index of which is controlled, has a quantum well structure.

38. An apparatus according to claim 31, wherein said waveguide in the region, the refractive index of which is controlled, has a monocrystalline structure.

39. An apparatus according to claim 31, wherein said control means applies a reverse field to said waveguide in the region, the refractive index of which is controlled, as the first and second actions.

40. An apparatus according to claim 31, wherein said control means injects a forward bias current into said waveguide in the region, the refractive index of which is controlled, as the first and second actions.

41. An apparatus according to claim 31, wherein said semiconductor laser device comprises a distributed reflection type laser device in which a diffraction grating serving as the resonator structure is arranged in series with said active layer, and said waveguide in the region, to which the first and second actions are applied, corresponds to the waveguide in a distributed reflection region in which the diffraction grating is arranged.

42. An apparatus according to claim 27, wherein the gains of the TE and TM modes are set to be substantially equal to each other by setting a ground level of heavy holes to be substantially equal to a ground level of light holes in said active layer.

43. An apparatus according to claim 42, wherein the gains of the TE and TM modes are set to be substantially equal to each other in such a manner that said active layer has a quantum well structure, and a quantum well of the quantum well structure is strained.

44. An apparatus according to claim 27, wherein said semiconductor laser device comprises a diffraction grating, and the gains of the TE and TM modes are set to be substantially equal to each other in such a manner that a Bragg wavelength of the TM mode of the diffraction grating is set to be substantially equal to a wavelength corresponding to a bandgap between ground levels of light holes and electrons of said active layer.

45. An apparatus according to claim 26, wherein the first action is an action when said control means does not perform any control.

46. A method of driving a semiconductor laser device having a resonator structure, said semiconductor laser device comprising:

an active layer;

a waveguide for guiding light generated by said active layer; and a layer neighboring at least a portion of said waveguide, said method comprising the step of:

controlling an optical confinement effect to said waveguide by controlling distribution states of refractive indices of said waveguide and said neighboring layer.

47. A method according to claim 46, wherein the step of controlling the optical confinement effect includes the step of controlling the refractive index of said neighboring layer.

48. A method according to claim 46, wherein the step of controlling the optical confinement effect includes the step of applying a reverse field to said neighboring layer.

49. A method according to claim 46, wherein the step of controlling the optical confinement effect includes the step of injecting a forward bias current into said neighboring layer.

50. A method according to claim 46, wherein the step of controlling the optical confinement effect includes the step of controlling the refractive index of said waveguide in a region other than a region where said active layer is present.

51. A method according to claim 46, wherein the step of controlling the optical confinement effect includes the step of applying a reverse field to said waveguide in a region other than a region where said active layer is present.

52. A method according to claim 46, wherein the step of controlling the optical confinement effect includes the step of injecting a forward bias current into said waveguide in a region other than a region where said active layer is present.

53. A method according to claim 46, wherein the step of controlling the optical confinement effect includes one of the step of controlling to apply an action for weakening the optical confinement effect for one, that performs laser oscillation, of TE and TM modes as two polarized wave modes of said waveguide and to perform laser oscillation of the other mode, and the step of controlling to apply an action for strengthening the optical confinement effect for the other mode and to perform laser oscillation of the other mode.

54. A method according to claim 46, wherein said semiconductor laser device comprises a plurality of electrodes in a propagation direction of light of said waveguide, thereby allowing one of uneven current injection and electric field application in the propagation direction of said waveguide, and said method further comprises the step of changing a laser oscillation wavelength by one of the uneven current injection and electric field application.

55. An optical communication system for performing a communication using an optical signal, comprising:

a transmission path for sending the optical signal;

a transmitter for transmitting the optical signal; and a receiver for receiving the optical signal, wherein said transmitter comprises a semiconductor laser apparatus for generating the optical signal, said apparatus comprising:

a semiconductor laser device having a resonator structure, said device comprising:

an active layer;

a waveguide for guiding light generated by said active layer; and a layer neighboring at least a portion of said waveguide; and control means for controlling an optical confinement effect to said waveguide by controlling distribution states of refractive indices of said waveguide and said neighboring layer.

56. A system according to claim 55, wherein refractive index distributions of said waveguide and said neighboring portion of said semiconductor laser device are set so that laser oscillation is performed in one of TE and TM modes as two polarized wave modes of said waveguide upon application of a first action by said control means, and laser oscillation is performed in the other mode upon application of a second action by said control means.

57. A system according to claim 56, wherein said transmitter further comprises a polarizer for selecting one of the two polarized wave modes output from said semiconductor laser device.

58. A system according to claim 55, wherein said semiconductor laser device comprises a plurality of electrodes in a propagation direction of light of said waveguide, thereby changing a laser oscillation wavelength by performing one of uneven current injection and electric field application in the propagation direction of said waveguide.

59. A semiconductor laser apparatus comprising:

a semiconductor laser device having a resonator structure, said device comprising;

an active layer;

a waveguide for guiding light generated by said active layer;

a layer neighboring at least a portion of said waveguide; and an electrode, with an electric field for controlling distribution states of refractive indices of said waveguide and said neighboring layer being applied to said electrode or a current for controlling distribution states of refractive indices of said waveguide and said neighboring layer being injected into said electrode.

60. A semiconductor laser apparatus according to claim 59, wherein the application of the electric field or the injection of the current is performed to said neighboring layer.

61. A semiconductor laser apparatus according to claim 59, wherein said electrode is provided on said neighboring layer.

62. A semiconductor laser apparatus according to claim 59, wherein the application of the electric field or the injection of the current is performed to said waveguide.

63. A semiconductor laser apparatus according to claim 59, wherein said electrode is provided on said waveguide.

64. A semiconductor laser apparatus according to claim 59, wherein the electric field is a reverse electric field.

65. A semiconductor laser apparatus according to claim 59, wherein at least one of said waveguide and said neighboring layer comprises a quantum well structure.

66. A semiconductor laser apparatus according to claim 59, wherein refractive index distributions of said waveguide and said neighboring layer are set to attain optical confinement sufficient for laser oscillation upon application of no action by said electrode.

67. A semiconductor laser apparatus according to claim 59, wherein refractive index distributions of said waveguide and said neighboring layer are set to attain optical confinement sufficient for laser oscillation upon application of an action by said electrode.

68. A semiconductor laser apparatus according to claim 59, wherein said neighboring layer is formed adjacent to said waveguide.

69. A semiconductor laser apparatus according to claim 59, wherein a high-resistance layer for improving electrical insulation between said active layer and said neighboring layer is formed between said active layer and said neighboring layer.

70. A semiconductor laser apparatus according to claim 59, wherein said active layer serves as at least a portion of said waveguide.

71. A semiconductor laser apparatus according to claim 59, wherein said semiconductor laser device comprises a diffraction grating as the resonator structure.

72. A semiconductor laser apparatus according to claim 59, wherein said semiconductor laser device comprises a Fabry-Perot type laser device having two opposing end faces as the resonator structure.

73. A semiconductor laser apparatus according to claim 71, wherein said semiconductor laser device comprises a distributed feedback type laser device in which the diffraction grating is formed along said active layer, and the diffraction grating has a phase shift structure.

74. A semiconductor laser apparatus according to claim 59, wherein said semiconductor device comprises a distributed reflection type laser device in which a diffraction grating serving as the resonator structure is arranged in series with said active layer, and said waveguide in a region, the refractive index of which is controlled, corresponds to the waveguide in a distributed reflection region in which the diffraction grating is arranged.

75. A semiconductor laser apparatus according to claim 59, wherein a plurality of electrodes are arranged in a propagation direction of light of said waveguide.

76. A semiconductor laser apparatus according to claim 59, wherein said semiconductor laser device has different gains in TE and TM modes as two polarized wave modes of said waveguide.

77. A semiconductor laser apparatus according to claim 76, wherein a difference between the gains of the TE and TM modes is obtained by setting a ground level of heavy holes to be different from a ground level of light holes in said active layer.

78. A semiconductor laser apparatus according to claim 76, wherein said semiconductor laser device comprises a diffraction grating, and the difference between the gains of the TE and TM modes is obtained in such a manner that:

a pitch of the diffraction grating is set so that one of a wavelength interval between a Bragg wavelength of the TE mode of the diffraction grating and a wavelength corresponding to a bandgap between ground levels of heavy holes and electrons of said active layer, and a wavelength interval between a Bragg wavelength of the TM mode of the diffraction grating and a wavelength corresponding to a bandgap between ground levels of light holes and electrons is smaller than the other.

79. A semiconductor laser apparatus according to claim 59, wherein refractive index distributions of said waveguide and said neighboring layer are set so that laser oscillation is performed in one of TE and TM modes as two polarized wave modes of said waveguide upon application of a first reverse electric field to said electrode or injection of a first current into said electrode, and laser oscillation is performed in the other mode upon application of a second reverse electric field to said electrode or injection of a second current into said electrode.

80. A semiconductor laser apparatus according to claim 79, wherein said semiconductor laser device has substantially equal gains of the TE and TM modes.

81. A semiconductor laser apparatus according to claim 79, wherein a change amount of a threshold gain of the TE mode upon switching from the application of the first reverse electric field to the application of the second reverse electric field, or from the injection of the first current to the injection of the second current is different from a change amount of a threshold gain of the TM mode upon switching from the application of the first reverse electric field to the application of the second reverse electric field, or from the injection of the first current to the injection of the second current, and wherein the threshold gain of the one mode that oscillates upon reception of the application of the first reverse electric field or the injection of the first current is smaller than that of the other mode upon reception of the application of the first reverse electric field or the injection of the first current, and the threshold gain of the other mode that oscillates upon reception of the application of the second reverse electric field or the injection of the second current is smaller than the threshold gain of the one mode upon reception of the application of the second reverse electric field or the injection of the second current.

82. A semiconductor laser apparatus according to claim 79, wherein a change amount of a refractive index difference between said waveguide and said neighboring layer for the TE mode upon switching from the application of the first reverse electric field to the application of the second reverse electric field, or from the injection of the first current to the injection of the second current is different from a change amount of refractive index difference between said waveguide and said neighboring layer for the TM mode upon switching from the application of the first reverse electric field to the application of the second reverse electric field, or from the injection of the first current to the injection of the second current.

83. A semiconductor laser apparatus according to claim 80, wherein the gains of the TE and TM mode are set to be substantially equal to each other by setting a ground level of heavy holes to be substantially equal to a ground level of light holes in said active layer.

84. A semiconductor laser apparatus according to claim 83, wherein the gains of the TE and TM mode are set to be substantially equal to each other in such a manner that said active layer has a quantum well structure, and a quantum well of the quantum well structure is strained.

85. A semiconductor laser apparatus according to claim 80, wherein said semiconductor laser device comprises a diffraction grating, and the gains of the TE and TM modes are set to be substantially equal to each other in such a manner that a Bragg wavelength of the TM mode of the diffraction grating is set to be substantially equal to a wavelength corresponding to a bandgap between ground levels of light holes and electrons of said active layer.

86. A semiconductor laser according to claim 79, wherein the application of the first reverse electric field or the injection of the first current is an action when said electrode does not perform any control.

87. An optical communication system for performing a communication using an optical signal, comprising:

a transmission path for sending the optical signal;

a transmitter for transmitting the optical signal; and a receiver for transmitting the optical signal, wherein said transmitter comprises a semiconductor laser apparatus for generating the optical signal, said apparatus comprising:

a semiconductor laser device having a resonator structure, said device comprising:

an active layer;

a waveguide for guiding light generated by said active layer; and a layer neighboring at least a portion of said waveguide; and an electrode, with an electric field for controlling distribution states of refractive indices of said waveguide and said neighboring layer being applied to said electrode or a current for controlling distribution states of refractive indices of said waveguide and said neighboring layer being injected into said electrode.

88. A system according to claim 87, wherein in said semiconductor laser device, refractive index distributions of said waveguide and said neighboring layer are set so that laser oscillation is performed in one of TE and TM modes as two polarized wave modes of said waveguide upon application of a first reverse electric field to said electrode or injection of a first current into said electrode and laser oscillation is performed in the other mode upon application of a second reverse electric field to said electrode or injection of a second current into said electrode.

* * * * *

UNITED STATES PATENT AND TRADEMARK OFFICE
CERTIFICATE OF CORRECTION

PATENT NO. : 5,764,670
DATED : June 9, 1998
INVENTOR(S) : TOSHIHIKO OUCHI It is certified that error appears in the above-identified patent and that said Letters Patent is hereby corrected as shown below:

COLUMN 7

Line 7, "(kg=1.15 μm)" should read --(λg=1.15 μm)--.

COLUMN 9

Line 22, "increase," should read --increased,--; and
　　Line 65, "increase," should read --increased,--.

COLUMN 24

Line 29, "wherein" should read --¶ wherein--.

Signed and Sealed this

Sixteenth Day of February, 1999

Attest:

*Attesting Officer*　　　　　*Acting Commissioner of Patents and Trademarks*